US012804968B2

United States Patent
(12) United States Patent
Reboh et al.

(10) Patent No.: US 12,804,968 B2
(45) Date of Patent: Nov. 17, 2026

(54) STACKED FIELD EFFECT TRANSISTORS

(71) Applicant: International Business Machines Corporation, Armonk, NY (US)

(72) Inventors: Shay Reboh, Guilderland, NY (US); Debarghya Sarkar, Latham, NY (US); Yasir Sulehria, Niskayuna, NY (US); Michael P. Belyansky, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 346 days.

(21) Appl. No.: 18/617,045

(22) Filed: Mar. 26, 2024

(65) Prior Publication Data

US 2025/0311319 A1 Oct. 2, 2025

(51) Int. Cl.

| | |
|---|---|
| ***H10D 62/10*** | (2025.01) |
| ***H10D 30/43*** | (2025.01) |
| ***H10D 30/67*** | (2025.01) |
| ***H10D 84/83*** | (2025.01) |

(52) U.S. Cl.

CPC ........... *H10D 62/115* (2025.01); *H10D 30/43* (2025.01); *H10D 30/6735* (2025.01); *H10D 30/6757* (2025.01); *H10D 84/83* (2025.01)

(58) Field of Classification Search

CPC .. H10D 62/115; H10D 30/43; H10D 30/6735; H10D 30/6757; H10D 84/83; H10D 30/014; H10D 64/017; H10D 84/0151; H10D 84/0188; H10D 84/85; H10D 88/00; H10D 88/01; H10D 84/038; H10D 62/121

See application file for complete search history.

(56) References Cited

U.S. PATENT DOCUMENTS

| | | | | |
|---|---|---|---|---|
| 11,069,684 | B1 * | 7/2021 | Xie | H10D 84/0167 |
| 11,201,153 | B2 | 12/2021 | Xie et al. | |
| 11,282,838 | B2 | 3/2022 | Zhang et al. | |
| 11,605,728 | B2 | 3/2023 | Lin et al. | |
| 12,356,680 | B2 * | 7/2025 | Zhou | H10D 62/116 |
| 12,575,147 | B2 * | 3/2026 | Baek | H10D 62/121 |
| 2020/0294998 | A1 | 9/2020 | Lilak et al. | |
| 2022/0157936 | A1 * | 5/2022 | Khaderbad | H10D 62/116 |
| 2023/0037957 | A1 * | 2/2023 | Thomas | H10D 84/856 |
| 2023/0073078 | A1 * | 3/2023 | Rachmady | H10D 86/60 |
| 2023/0178553 | A1 * | 6/2023 | Xie | H10D 64/017 257/351 |
| 2023/0268388 | A1 | 8/2023 | Xie et al. | |

(Continued)

*Primary Examiner* — Victor A Mandala

(74) *Attorney, Agent, or Firm* — Scully, Scott, Murphy & Presser, P.C.; Samuel Waldbaum

(57) ABSTRACT

A semiconductor device is provided that includes a multi-layered insulator region located between stacked FETs. The multilayered insulator region is referred to herein as a multi-dielectric material middle isolation structure. The multi-dielectric material middle isolation structure includes a middle dielectric isolation structure having a middle dielectric isolation spacer located at two opposing ends of, or surrounding, the middle dielectric isolation structure. The middle dielectric isolation spacer protects the middle dielectric isolation structure during processing of the stacked FETs such that no damage to the middle dielectric isolation structure and the semiconductor channel regions of the stacked FETs is observed.

18 Claims, 26 Drawing Sheets

(56) References Cited

U.S. PATENT DOCUMENTS

| | | | | |
|---|---|---|---|---|
| 2023/0290776 | A1 | 9/2023 | Mochizuki et al. | |
| 2023/0343823 | A1 * | 10/2023 | Baek | H10D 62/121 |
| 2024/0145584 | A1 * | 5/2024 | Frougier | H10D 84/85 |
| 2024/0387651 | A1 * | 11/2024 | Wang | H10D 30/6729 |
| 2025/0031440 | A1 * | 1/2025 | Ferrer | H10D 30/014 |
| 2025/0040242 | A1 * | 1/2025 | Park | H10D 30/014 |
| 2025/0089313 | A1 * | 3/2025 | Tsai | H10D 30/014 |
| 2025/0098278 | A1 * | 3/2025 | Moon | H10D 30/014 |
| 2025/0107176 | A1 * | 3/2025 | Chung | H10D 62/121 |
| 2025/0113560 | A1 * | 4/2025 | Zou | H10D 30/014 |
| 2025/0185307 | A1 * | 6/2025 | Xie | H10D 30/024 |
| 2025/0203946 | A1 * | 6/2025 | Reboh | H10D 30/014 |
| 2025/0204026 | A1 * | 6/2025 | Zhang | H10D 30/014 |
| 2025/0254918 | A1 * | 8/2025 | Kang | H10D 30/014 |
| 2025/0254974 | A1 * | 8/2025 | Yang | H10D 30/014 |
| 2025/0294887 | A1 * | 9/2025 | Zhang | H10D 89/10 |
| 2026/0082675 | A1 * | 3/2026 | Shih | H10D 84/0188 |
| 2026/0082692 | A1 * | 3/2026 | Li | H10D 84/834 |

* cited by examiner

STACKED FIELD EFFECT TRANSISTORS

BACKGROUND

The present application relates to semiconductor technology, and more particularly to a semiconductor device including a second field effect transistor (FET) stacked over a first FET and a multilayered insulator region located between the stacked first and second FETs.

Stacked FETs are a configuration in which two FETs are vertically integrated on a semiconductor substrate. These FETs are stacked on top of each other resulting in a compact structure that combines the individual benefits of each of the FETs. Stacked FETs have a reduced footprint and an increased efficiency compared to non-stacked FETs. The increased efficiency can include, for example, a lower on-state resistance, a lower gate charge and/or a parasitic inductance resistance.

SUMMARY

A semiconductor device is provided that includes a multilayered insulator region located between stacked FETs. The multilayered insulator region is referred to herein as a multi-dielectric material middle isolation structure. The multi-dielectric material middle isolation structure includes a middle dielectric isolation structure having a middle dielectric isolation spacer located at two opposing ends of, or surrounding, the middle dielectric isolation structure. The middle dielectric isolation spacer protects the middle dielectric isolation structure during processing of the stacked FETs such that no damage to the middle dielectric isolation structure and the semiconductor channel regions of the stacked FETs is observed.

In one embodiment of the present application, the semiconductor device includes a first FET, a second FET stacked over the first FET, and a multi-dielectric material middle isolation structure located between the first FET and the second FET. The multi-dielectric material middle isolation structure includes a middle dielectric isolation structure having a first end and a second end, opposite the first end, and a middle dielectric isolation spacer located at the first end and the second end of the middle dielectric isolation structure.

In another embodiment of the present application, the semiconductor device includes a first FET, a second FET stacked over the first FET, and a multi-dielectric material middle isolation structure located between the first FET and the second FET. The multi-dielectric material middle isolation structure includes a middle dielectric isolation structure having a middle dielectric isolation spacer surrounding the middle dielectric isolation structure.

DETAILED DESCRIPTION

Figure 1B:
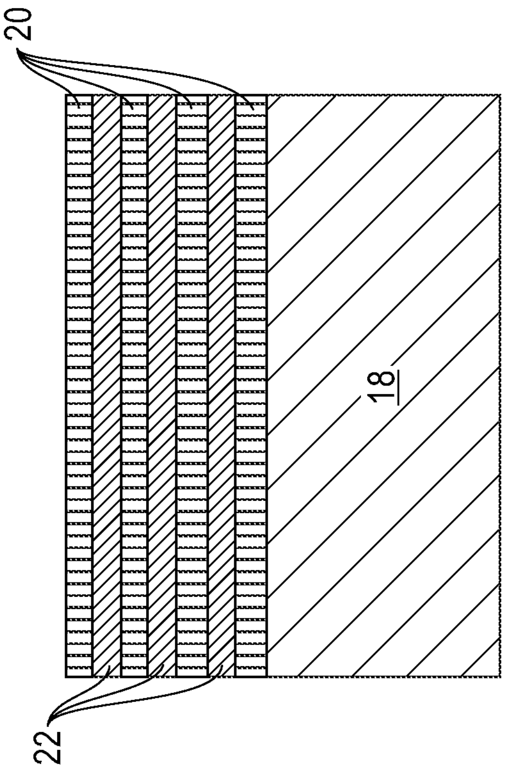
FIG. 1B is a cross sectional view of a second exemplary structure that can be employed in the present application, the second exemplary structure including a second semiconductor substrate, and a second material stack of alternating second sacrificial semiconductor material layers and second semiconductor channel material layers.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the embodiment described in the present application, the stacked transistors are nanosheet transistors. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. Nanosheet transistors provide considerable scaling with high drive current capability. Nanosheet transistors provide a larger drive current for a given footprint compared to finFET technology. Although nanosheet transistors are described in this application, this application is not limited to nanosheet transistors. Instead, the present application can be used for finFETs, nanowire FETs, planar FETs, fork sheet transistors, or any combination of such FETs including nanosheet transistors.

In the present application, the semiconductor device includes a frontside and a backside. The frontside includes a side of the device that includes at least one stacked transistor, frontside contact structures, and a frontside BEOL structure. The backside of the semiconductor device is the side of the device that is opposite the frontside. The backside includes a backside contact structures, and a backside interconnect structure.

In a stacked FET framework, wafer bonding allows for independent channel engineering (material and crystal orientation) of the stacked (i.e., top and bottom) FETs. Silicon dioxide is the most convenient bonding dielectric material to forming the bonding interface between the top FET and the bottom FET. Silicon dioxide provides strong bonding and good management of the wafer bonding reaction byproducts. However, any physically exposed bonding silicon dioxide material can be severely consumed during some key processes of device integration. In the present application, a means to protect the bonding dielectric layer is provided.

Figure 14A:
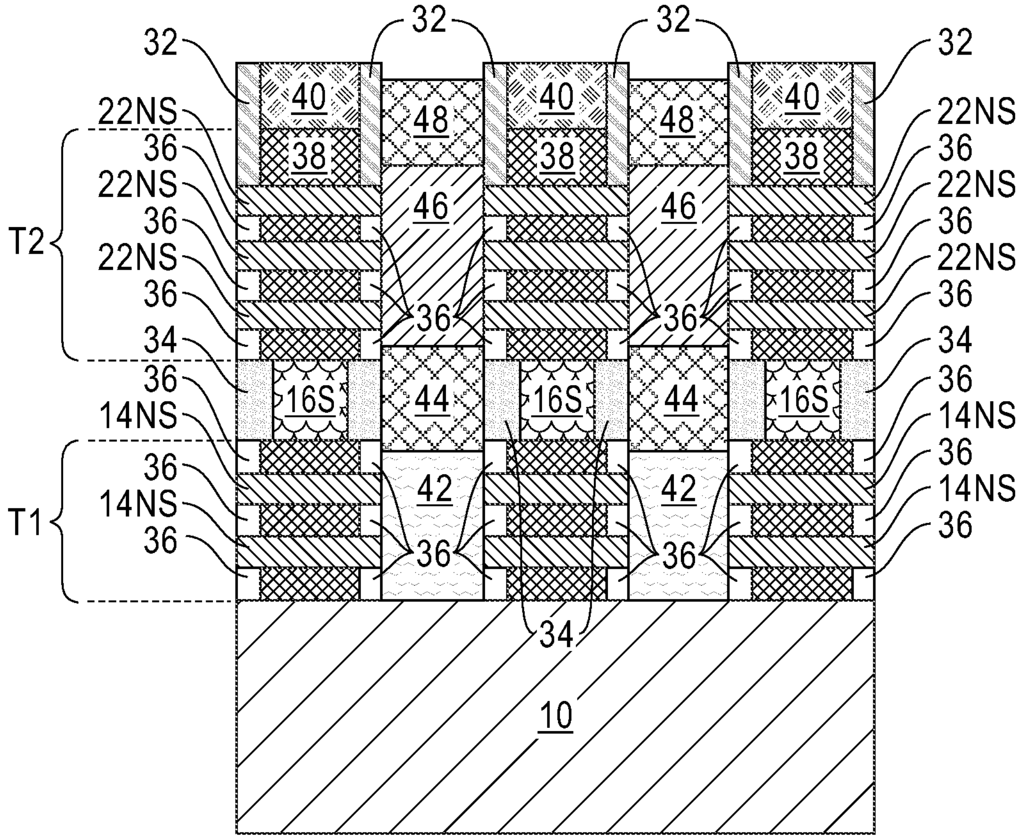
FIG. 14A is a cross sectional view of the exemplary structure shown in FIG. 13 after stacked FET formation.
Figure 14C:
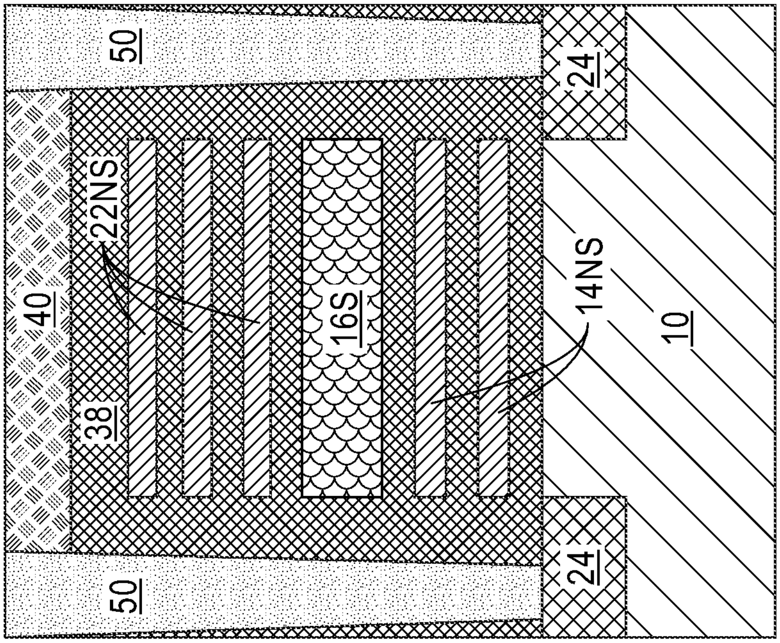
FIGS. 14B and 14C are cross sectional views of the exemplary structure shown in FIG. 14A through cut B-B and C-C of FIG. 4, respectively.
Figure 14B:
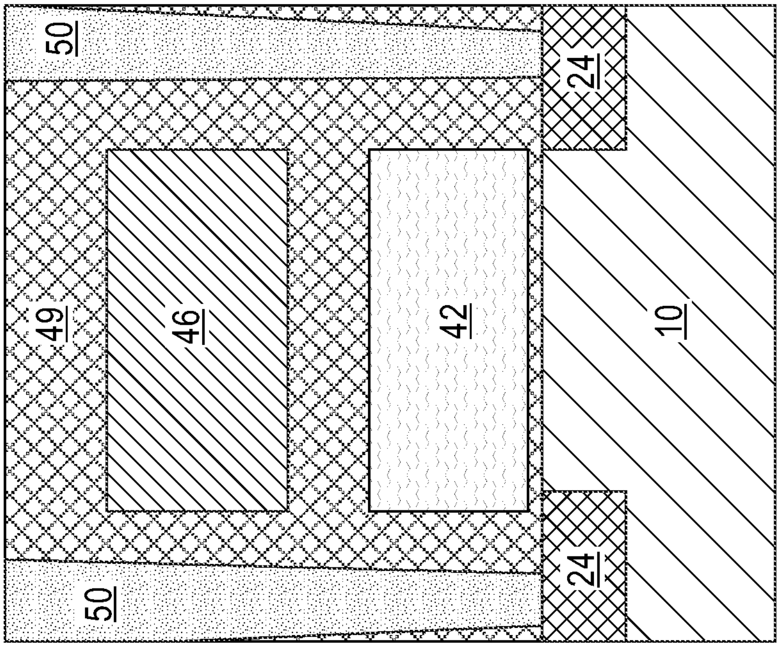
Figure 19A:
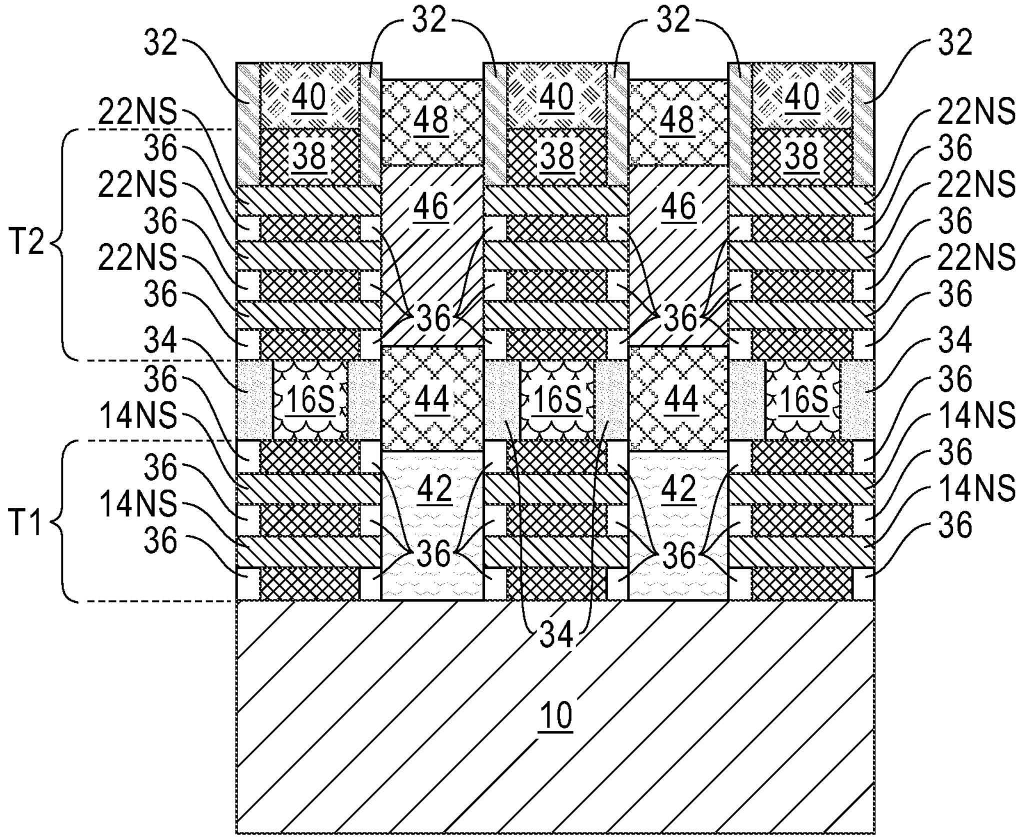
FIGS. 19A, 19B and 19C are cross sectional views of the exemplary structure shown in FIGS. 18A, 18B and 18C, respectively, after nanosheet formation and stack FET formation.
Figure 19C:
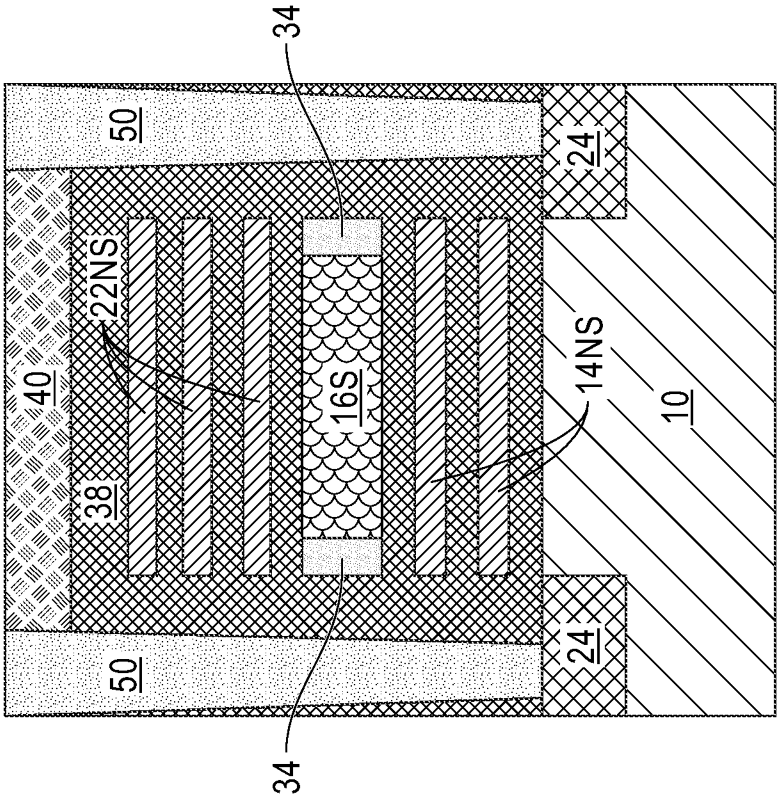
Figure 19B:
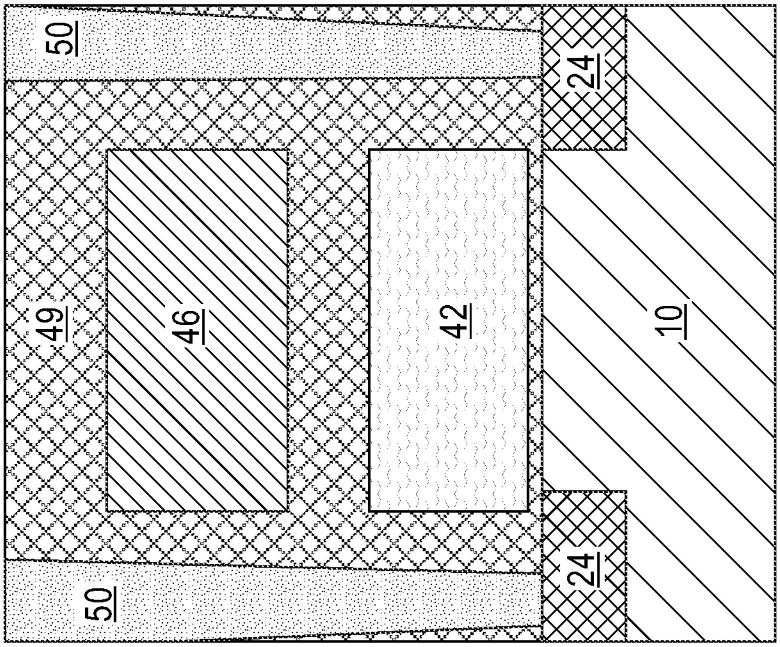

In the present application, a semiconductor device such as, is illustrated in FIGS. 14A-14C is provided that includes a first FET, T1, a second FET, T2, stacked over the first FET, T1, and a multi-dielectric material middle isolation structure located between the first FET, T1 and the second FET, T2. The multi-dielectric material middle isolation structure includes a middle dielectric isolation structure 16S having a first end and a second end, opposite the first end, and a middle dielectric isolation spacer 34 is located at each of the first end and the second end of the middle dielectric isolation structure 16S. FIGS. 19A-19C illustrate a similar semiconductor device except that the middle dielectric isolation spacer 34 surrounds the middle dielectric isolation structure 16S and thus it is ring-shaped. In either embodiment, the middle dielectric isolation spacer 34 protects the middle dielectric isolation structure 16S during processing of the stacked FETs such that no damage to the middle dielectric isolation structure 16S and the semiconductor channel regions of stacked FETs is observed (in the illustrated embodiments, the semiconductor channel region of the first FET, T1, includes vertically stacked and spaced apart first semiconductor channel material nanosheets 14NS, and the semiconductor channel region of the second FET, T2, includes vertically stacked and spaced apart second semiconductor channel material nanosheets 22NS).

Figure 1A:
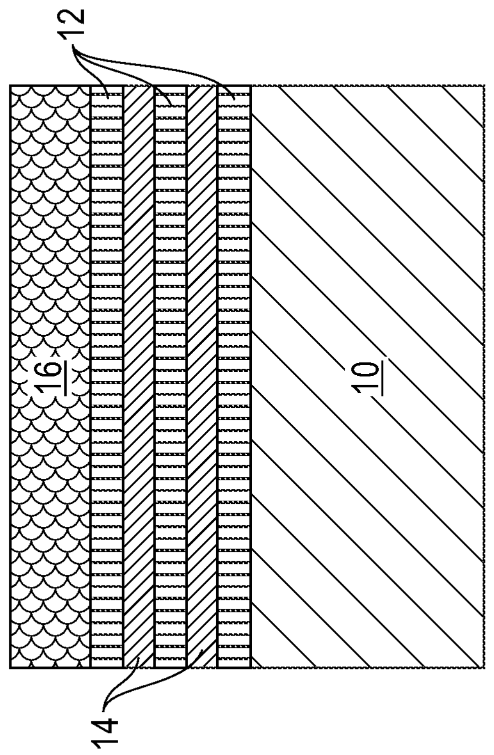
FIG. 1A is a cross sectional view of a first exemplary structure that can be employed in the present application, the first exemplary structure including a first semiconductor substrate, a first material stack of alternating first sacrificial semiconductor material layers and first semiconductor channel material layers, and a bonding dielectric layer.

Referring now to FIG. 1A, there is illustrated a first exemplary structure that can be employed in the present application. The first exemplary structure illustrated in FIG. 1A includes a first semiconductor substrate 10, a first material stack of alternating first sacrificial semiconductor material layers 12 and first semiconductor channel material layers 14, and a bonding dielectric layer 16. In some embodiments of the present application, the bonding dielectric layer 16 is omitted from the first exemplary structure and is present on an uppermost surface of the second material stack of the second exemplary structure. In yet other embodiments, a first portion of the bonding dielectric layer 16 is present on an uppermost surface of the first material stack of the first exemplary structure and a second portion of the bonding dielectric layer 16 is present on an uppermost surface of the second material stack of the second exemplary structure. The uppermost surface of the first and second material stacks includes one of the sacrificial semiconductor material layers mentioned above for the first and second material stacks.

The first semiconductor substrate 10 is composed of at least one semiconductor material having semiconducting properties. Illustrative examples of semiconductor materials that can be used in providing the first semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, the first semiconductor substrate 10 is entirely composed of one or more semiconductor materials. In other embodiments, the first semiconductor substrate 10 can include a buried dielectric layer (e.g., silicon dioxide and/or boron nitride) sandwiched between a semiconductor base layer and a semiconductor device layer; the semiconductor device layer can be processed to include stacked FETs thereon.

As mentioned above, the first material stack includes alternating first sacrificial semiconductor material layers 12 and first semiconductor channel material layers 14. As is illustrated in FIG. 1A, the first material stack can include "n" number of first semiconductor channel material layers 14 and "n+1" number of first sacrificial semiconductor material layers 12, wherein n is an integer starting from 1, typically n is 2 or more. In such an embodiment, each first semiconductor channel material layer 14 would be sandwiched between a bottom first sacrificial semiconductor material layer and a top first sacrificial semiconductor material layer.

Each first sacrificial semiconductor material layer 12 is composed of a first semiconductor material, while each first semiconductor channel material layer 14 is composed of a second semiconductor material that is compositionally different from the first semiconductor material. In some embodiments, the second semiconductor material that provides each first semiconductor channel material layer 14 can provide high channel mobility for n-type FET devices (i.e., NFETs). In other embodiments, the second semiconductor material that provides each first semiconductor channel material layer 14 can provide high channel mobility for p-type FET devices (PFETs). The first semiconductor material that provides each first sacrificial semiconductor material layer 12, and the second semiconductor material that provides each first semiconductor channel material layer 14 can include one of the semiconductor materials mentioned above for the semiconductor substrate 10. In one example, the first semiconductor material that provides each first sacrificial semiconductor material layer 12 is composed of a silicon germanium alloy having a germanium content from 20 atomic percent to 40 atomic percent and the second semiconductor material that provides each first semiconductor channel material layer 14 is composed of silicon. Other combinations of semiconductor materials are possible as long as the first semiconductor material is compositionally different from the second semiconductor material.

The bonding dielectric layer 16 is composed of a first dielectric material such as, for example, silicon dioxide.

The first exemplary structure illustrated in FIG. 1A can be formed by forming the first material stack on the first semiconductor substrate 10. The forming of the first material stack includes one or more deposition processes including for example, chemical vapor deposition (CVD), plasma enhanced chemical vapor deposition (PECVD) or epitaxial growth. In one exemplary embodiment, the first material stack is formed by epitaxial growing in an alternating manner a first sacrificial semiconductor material layer 12 and a first semiconductor channel material layer 14. Throughout the present application, the terms "epitaxial growth" or "epitaxially growing" mean the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 450 °C. to 900 °C. Although higher temperature typically results in faster deposition, the faster deposition may result in crystal defects and film cracking. When present, and in one embodiment of the present application, the bonding dielectric layer 16 (either the entirety thereof or a portion thereof) can be formed by a deposition process such as, for example, CVD, PECVD, atomic layer deposition (ALD), or physical vapor deposition (PVD). In an alternative embodiment, a thermal oxidation process can be used to form the bonding dielectric layer 16.

Referring now to FIG. 1B, there is illustrated a second exemplary structure that can be employed in the present application. The second exemplary structure illustrated in FIG. 1B includes a second semiconductor substrate 18, and a second material stack of alternating second sacrificial semiconductor material layers 20 and second semiconductor channel material layers 22. In some embodiments of the present application, and when the bonding dielectric layer 16 is omitted from the first exemplary structure, the bonding dielectric layer 16 can be present on an uppermost surface of the second material stack (such an embodiment is not illustrated in the drawings of the present application). In yet other embodiments, a first portion of the bonding dielectric layer 16 is present on an uppermost surface of the first material stack of the first exemplary structure and a second portion of the bonding dielectric layer 16 on an uppermost surface of the second material stack of the second exemplary structure. The uppermost surface of the first and second material stacks includes one of the sacrificial semiconductor material layers of the first and second material stacks mentioned above.

The second semiconductor substrate 18 is composed of one of the semiconductor materials mentioned above for the first semiconductor substrate 10. The second semiconductor substrate 18 can be composed of a compositionally same, or compositionally different, semiconductor material as the first semiconductor substrate 10. The second semiconductor substrate 18 is typically, but not necessarily always, composed of a single semiconductor material such as, for example, Si. In the illustrated embodiment, the second semiconductor substrate 18 is a carrier wafer which will be removed after bonding of the second exemplary structure to the first exemplary structure.

As mentioned above, the second material stack includes alternating second sacrificial semiconductor material layers 20 and second semiconductor channel material layers 22. As is illustrated in FIG. 1B, the second material stack can include “m” number of second semiconductor channel material layers 22 and “m+1” number of second sacrificial semiconductor material layers 20, wherein m is an integer starting from 1, typically m is 2 or more. In the present application, m can be equal to, greater than or less than n. In the present application, each second semiconductor channel material layer 22 would be sandwiched between a bottom second sacrificial semiconductor material layer and a top second sacrificial semiconductor material layer.

Each second sacrificial semiconductor material layer 20 is composed of the first semiconductor material, while each second semiconductor channel material layer 22 is composed of a third semiconductor material that is compositionally different from the first semiconductor material. The third semiconductor material can be compositionally the same as, or compositionally different than, the second semiconductor material. In some embodiments, the third semiconductor material that provides each second semiconductor channel material layer 22 can provide high channel mobility for n-type FET devices (i.e., NFETs). In other embodiments, the third semiconductor material that provides each second semiconductor channel material layer 22 can provide high channel mobility for p-type FET devices (PFETs). The first semiconductor material that provides each second sacrificial semiconductor material layer 20, and the third semiconductor material that provides each second semiconductor channel material layer 22 can include one of the semiconductor materials mentioned above for the semiconductor substrate 10. In one example, the first semiconductor material that provides each second sacrificial semiconductor material layer 20 is composed of a silicon germanium alloy having a germanium content from 20 atomic percent to 40 atomic percent and the third semiconductor material that provides each second semiconductor channel material layer 22 is composed of silicon. Other combinations of semiconductor materials are possible as long as the first semiconductor material is compositionally different from the third semiconductor material.

The second exemplary structure illustrated in FIG. 1B can be formed by forming the second material stack on the second semiconductor substrate 18. The forming of the second material stack includes one or more of the deposition processes as mentioned above in forming the first exemplary structure.

Figure 2:
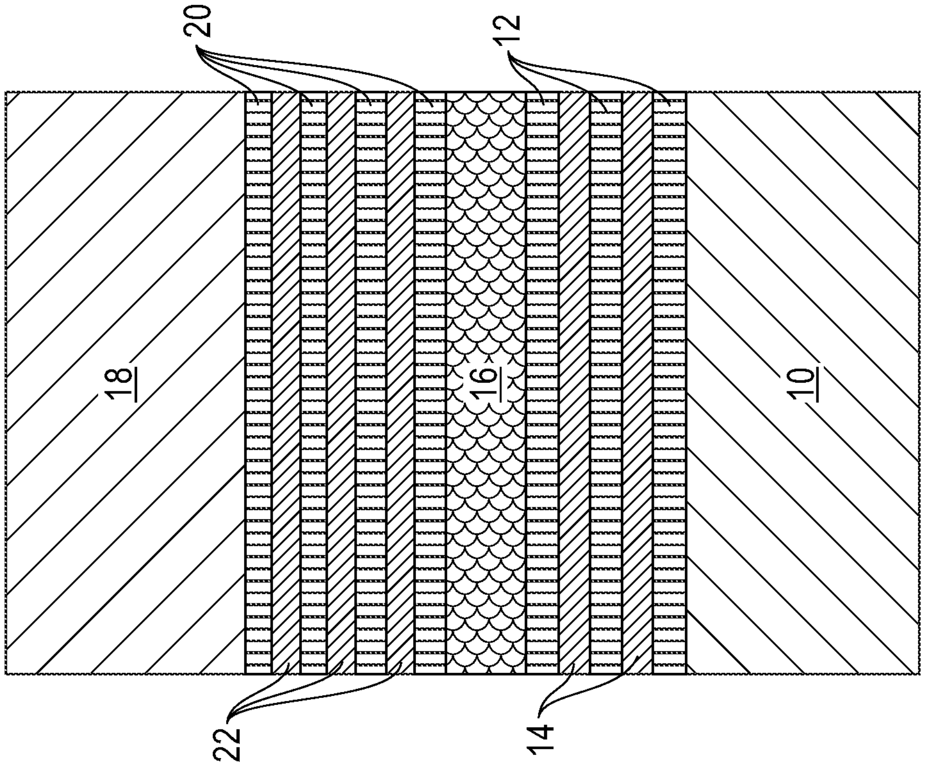
FIG. 2 is a cross sectional view of an exemplary structure after bonding the second exemplary structure of FIG. 1B to the first exemplary structure of FIG. 1A along the bonding dielectric layer.

Referring now to FIG. 2, there is illustrated an exemplary structure after bonding the second exemplary structure of FIG. 1B to the first exemplary structure of FIG. 1A along the bonding dielectric layer 16. In the present application and after bonding, the bonding dielectric layer 16 has a first interface with a topmost first sacrificial semiconductor material layer of the first material stack and a second interface with a bottommost second sacrificial semiconductor material layer of the flipped second material stack. In the illustrated embodiment, bonding includes flipping the second exemplary structure illustrated in FIG. 1B by 180°, bringing the flipped second exemplary structure in intimate contact with the first exemplary structure, and heating the contacted exemplary structure to form a bonded structure as shown in FIG. 2. When the bonding dielectric layer 16 is present only on one of the exemplary structures, the intimate contact occurs between the bonding dielectric layer 16 of either the first exemplary or the second exemplary structure and an uppermost sacrificial semiconductor material layer of either the first material stack or the second material stack. When a portion of the bonding dielectric layer 16 is present on both the exemplary structures, the intimate contact occurs between the first portion of the bonding dielectric layer 16 that is present on the first material stack, and the second portion of the bonding dielectric layer 16 that is present on the second material stack. The heating step used in the bonding process can be performed at a temperature from 25 °C. to 500 °C.

Figure 3:
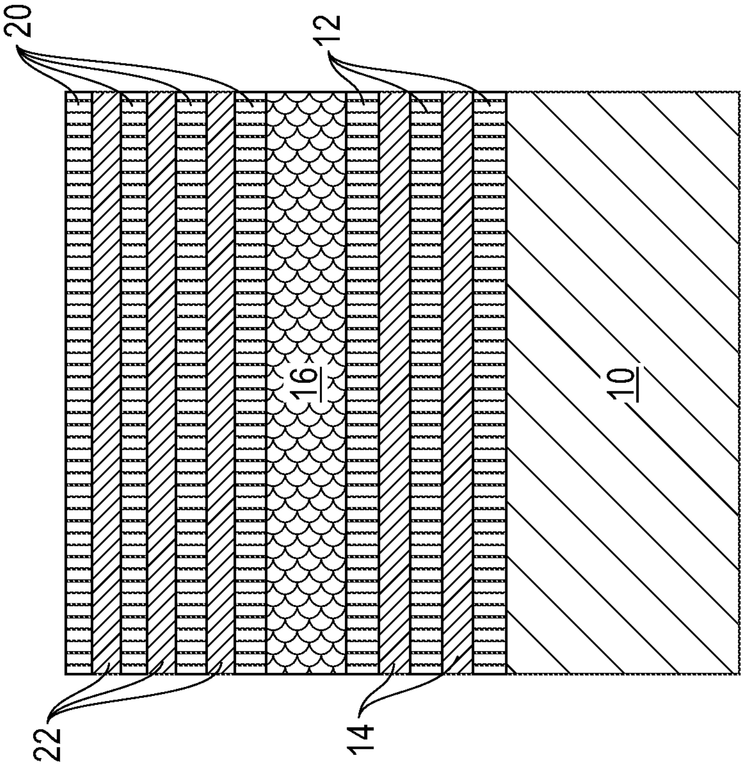
FIG. 3 is a cross sectional view of the exemplary structure shown in FIG. 2 after removing the second semiconductor substrate.

Referring now to FIG. 3, there is illustrated the exemplary structure shown in FIG. 2 after removing the second semiconductor substrate 18. The second semiconductor substrate 18 can be removed utilizing a material removal process such as, for example, a planarization process. The planarization process can include chemical mechanical polishing (CMP) or grinding, After removing the second semiconductor substrate 18, the second material stack is revealed as illustrated in FIG. 3.

Figure 4:
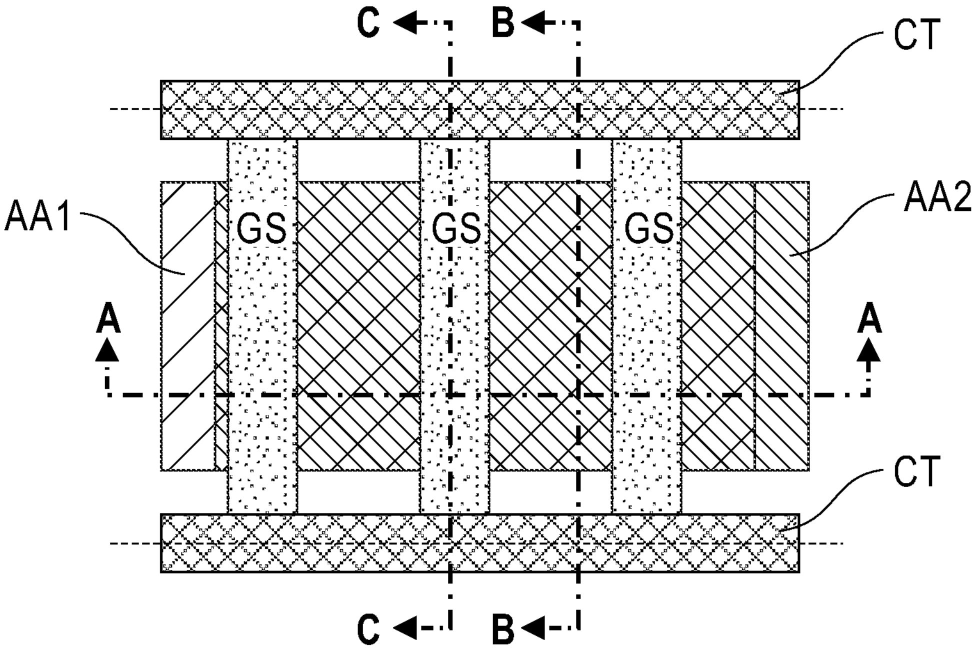
FIG. 4 is a top down view of a device layout that can be used in the present application.

Referring now to FIG. 4, there is illustrated a device layout that can be used in the present application. The device layout includes a first (i.e., bottom) active area AA1 of a first FET and a second (i.e., top) active area AA2 of a second FET stacked over AA1. Also shown are gate structures GS that lie parallel to each other and are present in both the first and second active areas. The gate structures GS represent a component of the first FET and the second FET. A gate cut structure CT is present at each of the ends of the gate structures GS. The device layout of FIG. 3 includes cut A-A, cut B-B and cut C-C. Cut A-A is a cut through each of the gate structures GS (i.e., a cross gate view). Cut B-B is a cut through the source/drain region of two adjacent gate structures GS. Cut C-C is a cut through the middle gate structure GS (i.e., a through gate view).

Figure 5A:
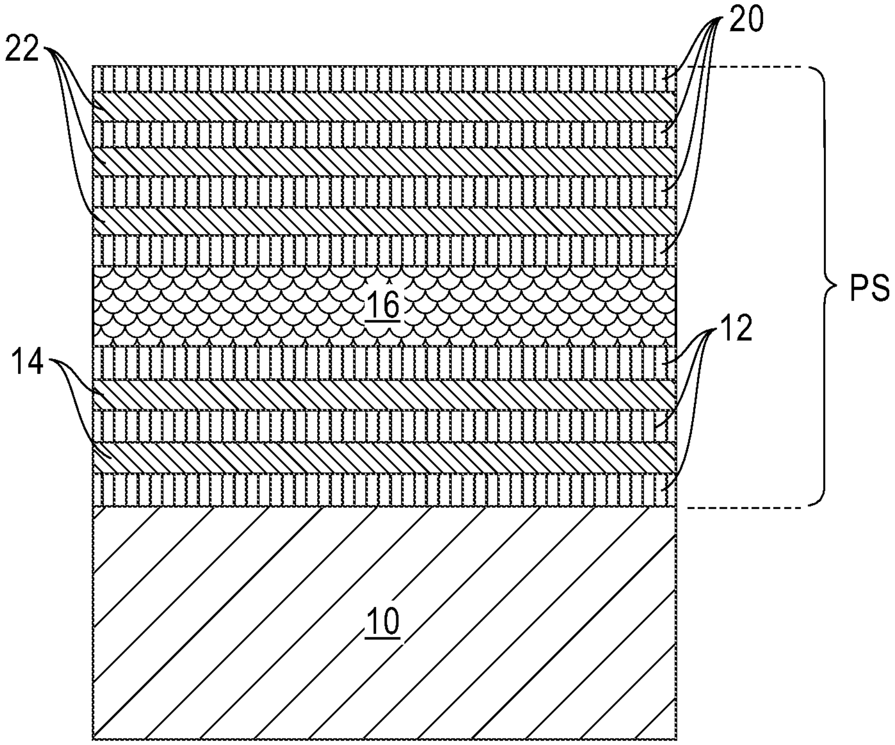
FIGS. 5A, 5B and 5C are cross sectional views of the exemplary structure shown in FIG. 3 through cut A-A, cut B-B and cut C-C, respectively, of FIG. 4, after patterning the second material stack, the bonding dielectric layer and the first material stack into a patterned stack, and forming a shallow trench isolation structure.
Figure 5C:
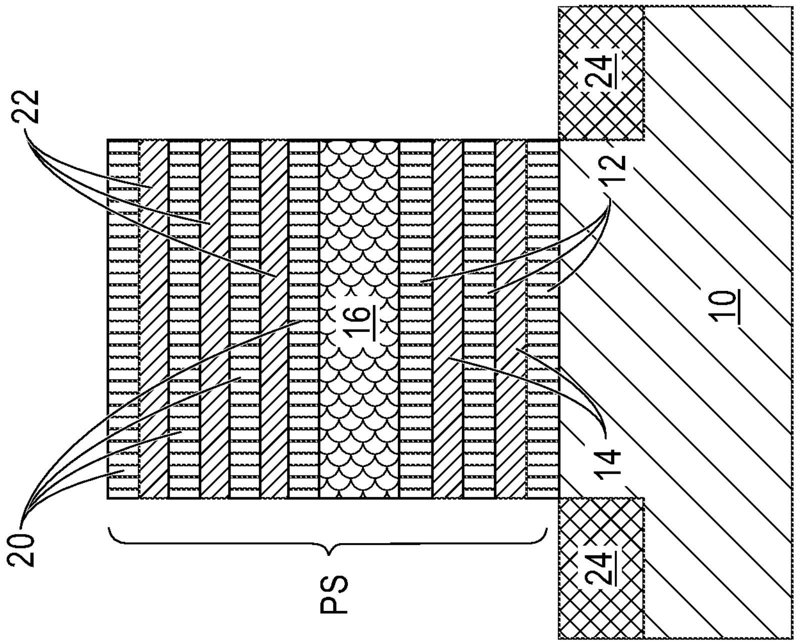
Figure 5B:
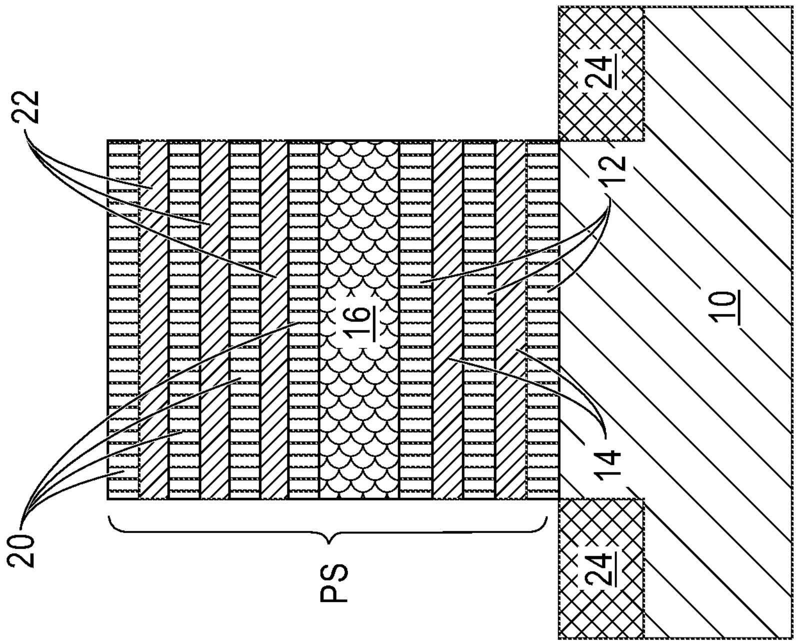

Referring now to FIGS. 5A, 5B and 5C, there are illustrated the exemplary structure shown in FIG. 3 through cut A-A, cut B-B and cut C-C, respectively, of FIG. 4, after patterning the second material stack, the bonding dielectric layer 16 and the first material stack into a patterned stack PS, and forming a shallow trench isolation structure 24. The patterning includes lithography and etching. Throughout the present application, lithography denotes a process in which a photoresist material is first formed on a layer or structure that needs to be patterned. The photoresist material can be formed by a deposition process including, for example, CVD, PECVD or spin-on coating. The as-deposited photoresist material is then subjected to a desired pattern of irradiation. The exposed photoresist material is then developed utilizing a conventional resist developer. The etch used in the patterning process can include, for example, a dry etching process, a wet chemical etching process or a combination of dry etching and wet chemical etching. Dry etching can include reactive ion etching (RIE), ion beam etching (IBE) or plasma etching. Although a single patterned stack is described and illustrated, a plurality of patterned stacks can be formed.

The patterned stack PS illustrated in FIGS. 5A, 5B and 5C includes a remaining (i.e., non-etched) portion of each of the second material stack, the bonding dielectric layer 16 and the first material stack. The remaining (i.e., non-etched) portion of the second material stack includes unetched portions of each second sacrificial semiconductor material layer 20 and each second semiconductor channel material layer 22. The remaining (i.e., non-etched) portion of the first material stack includes unetched portions of each first sacrificial semiconductor material layer 12 and each second semiconductor channel material layer 14. The patterned stack PS typically has sidewalls that are substantially perpendicular to a horizontal surface of the first semiconductor substrate 10.

The shallow trench isolation structure 24 is composed of any trench dielectric material such as, for example, silicon oxide. In some embodiments, a trench dielectric liner composed of, for example, SiN, can be present along a sidewall and a bottom wall of the trench dielectric material. The shallow trench isolation structure 24 can have a topmost surface that is substantially coplanar with, or slightly below or above, a topmost surface of the first semiconductor substrate 10. The shallow trench isolation structure 24 can be formed by first forming a trench in the first semiconductor substrate 10. The trench can be formed by lithography and etching. The trench is then filled (by a deposition process) with at least the trench dielectric material. A recess etch can then following the filling of the trench with at least the trench dielectric material.

Figure 6A:
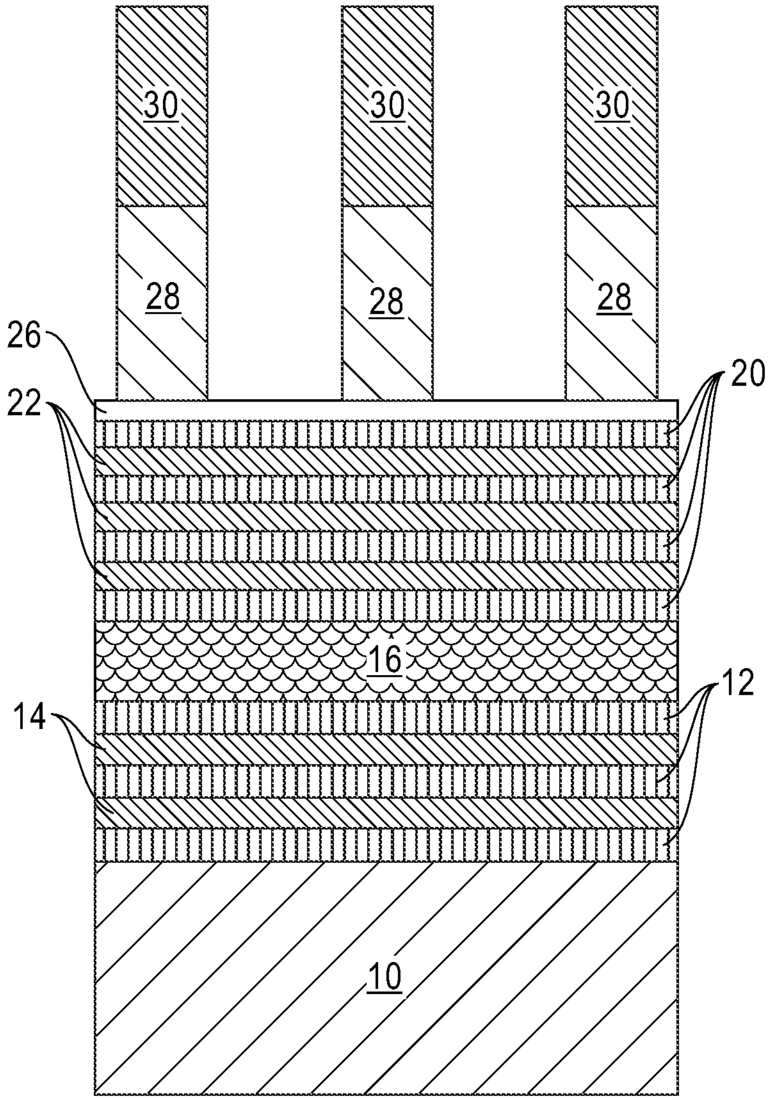
FIGS. 6A, 6B and 6C are cross sectional views of the exemplary structure shown in FIGS. 5A, 5B and 5C, respectively, after forming at least one sacrificial gate structure on the patterned stack.
Figure 6B:
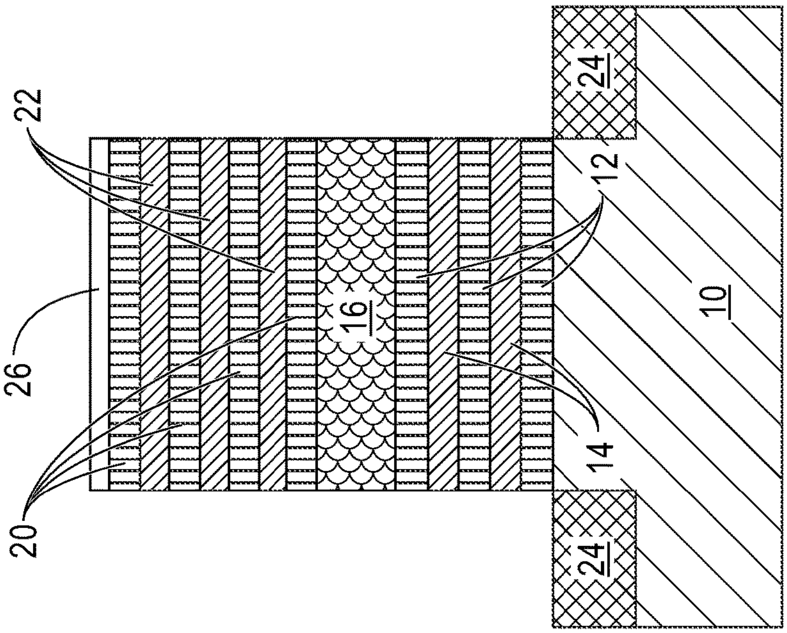
Figure 6C:
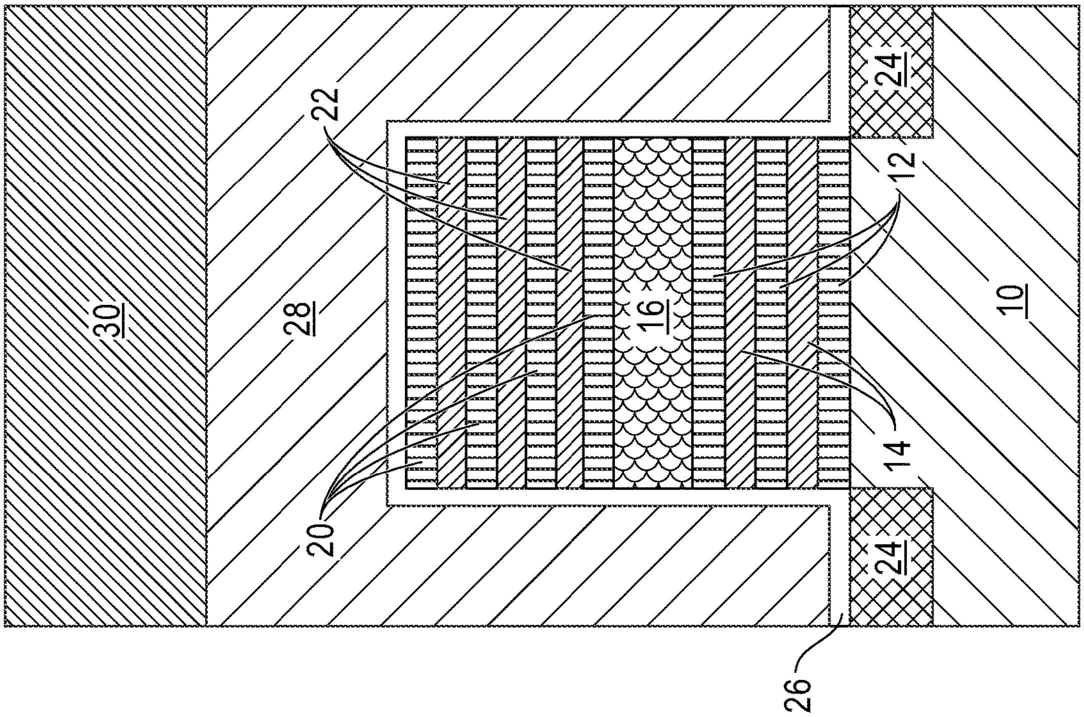

Referring now to FIGS. 6A, 6B and 6C, there are illustrated the exemplary structure shown in FIGS. 5A, 5B and 5C, respectively, after forming at least one sacrificial gate structure 28 on the patterned stack PS. In some embodiments, and prior to forming the at least sacrificial gate structure 28, a sacrificial liner 26 is formed on the patterned stack PS and the shallow trench isolation structure 24. In some embodiments, a sacrificial gate cap 30 can be formed on top of the at least one sacrificial gate structure 28. In the illustrated embodiment, three sacrificial gate structures 28 are shown by way of an example. The present application is not limited to any number of sacrificial gate structures 28 so long as at least one sacrificial gate structure 28 is formed. In the present application, the at least one sacrificial gate structure 28 straddles (i.e., is located along sidewalls and a topmost surface of the patterned stack PS) the patterned stack PS as is shown in FIG. 6C.

The sacrificial liner 26 is composed of a dielectric oxide such as, for example, silicon dioxide. The sacrificial liner 26 is optional and thus can omitted in some embodiments of the present application.

The at least sacrificial gate structure 28 includes at least a sacrificial gate material. The sacrificial gate material can be composed of, for example, polysilicon, amorphous silicon, amorphous silicon germanium or amorphous germanium.

The sacrificial gate cap 30 is composed of any dielectric hard mask material such as, for example, silicon nitride, silicon oxide, and/or silicon oxynitride.

The exemplary structure illustrated in FIGS. 6A, 6B and 6C can be formed by first depositing (e.g., CVD, PECVD, PVD or ALD) the sacrificial liner 26 on physically exposed surfaces of the exemplary structure shown in FIGS. 5A, 5B and 5C. The sacrificial liner 26 can be a conformal layer. Throughout the present application, the term "conformal layer" denotes a layer having a thickness as measured from a vertical surface of another layer or structure that is substantially equal to a thickness of the layer as measured from a horizontal surface of the another layer or the structure. In some embodiments, the forming of the sacrificial liner 26 is omitted. A blanket layer of the sacrificial gate material is then deposited (e.g., CVD, PECVD, ALD or PVD), followed by deposition (e.g., CVD, PECVD, ALD or PVD) of a blanket layer of a dielectric hard mask material, if the same is present. A patterning process including lithography and etching is then used to form at least one sacrificial gate structure 28 and, if present, the sacrificial gate cap 30. When the sacrificial liner 26 is present, the etch stops on top of the sacrificial liner 26. When the sacrificial liner 26 is not present, the etch can stop on the uppermost surface of the patterned stack PS.

Figure 7A:
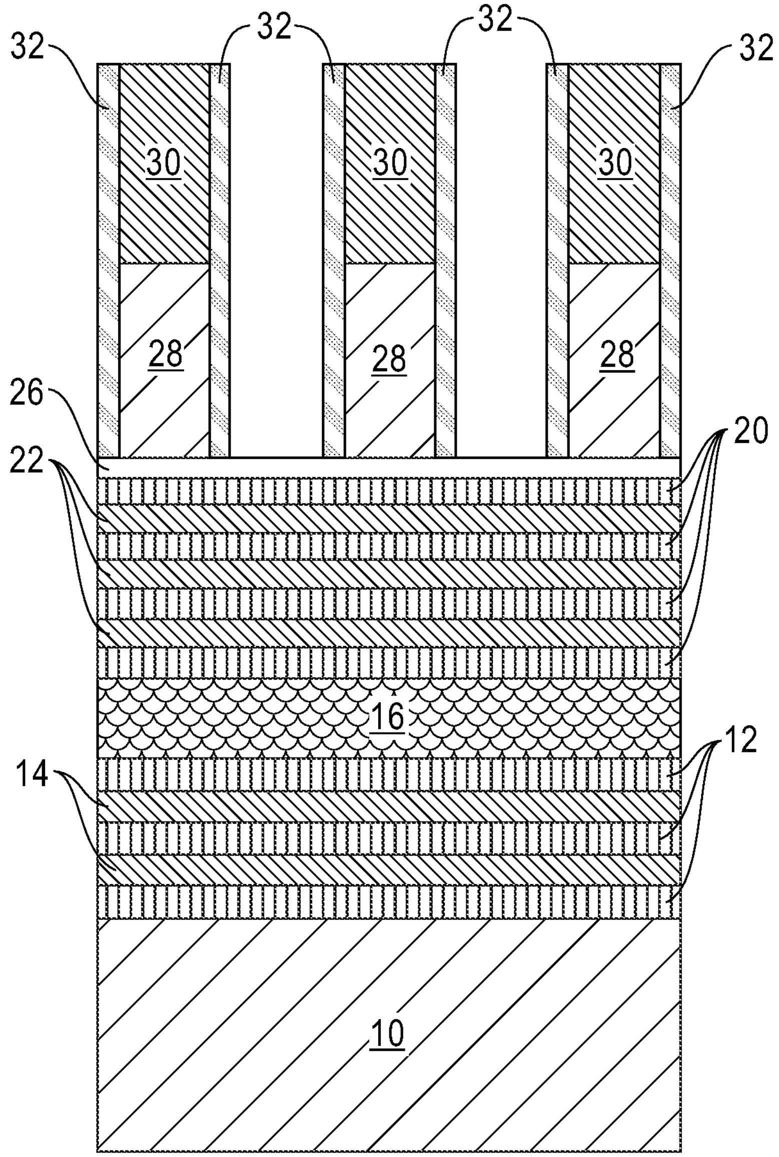
FIGS. 7A, 7B and 7C are cross sectional views of the exemplary structure shown in FIGS. 6A, 6B and 6C, respectively, after forming a gate dielectric spacer along the sidewall of the at least one sacrificial gate structure.
Figure 7C:
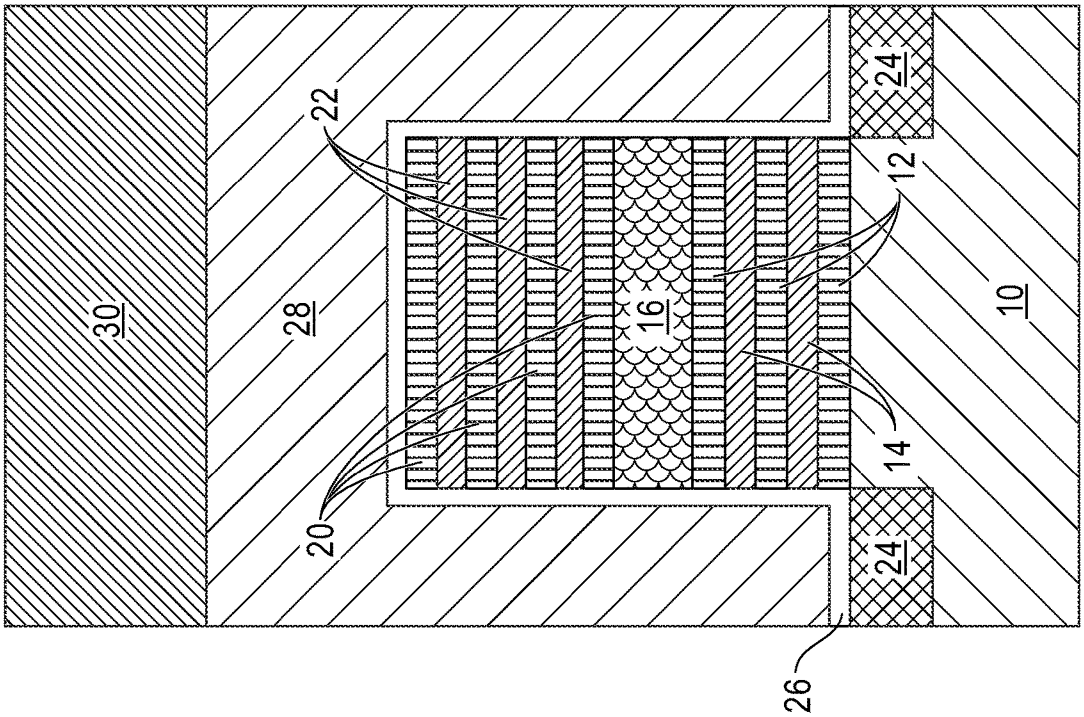
Figure 7B:
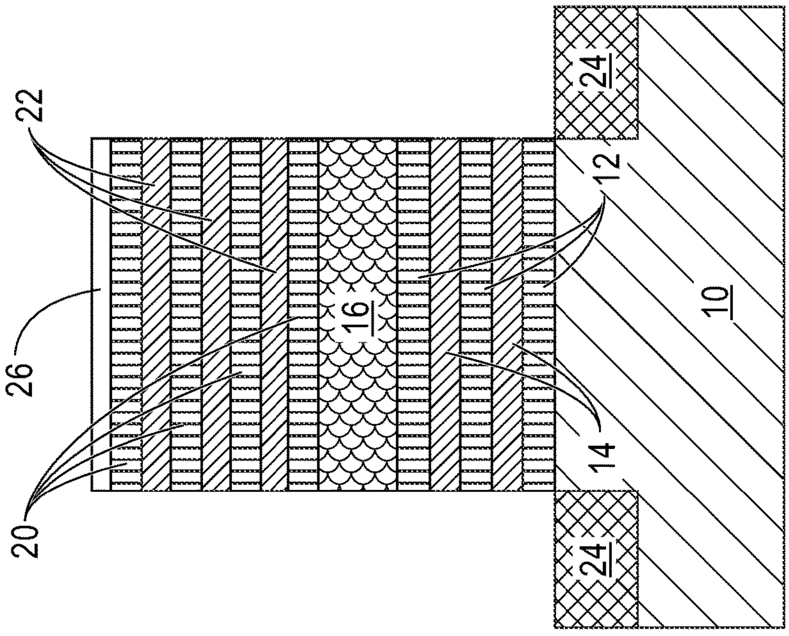

Referring now to FIGS. 7A, 7B and 7C, there are illustrated the exemplary structure shown in FIGS. 6A, 6B and 6C, respectively, after forming a gate dielectric spacer 32 along the sidewall of the at least one sacrificial gate structure 28. When the sacrificial gate cap 30 is present, the gate dielectric spacer 32 can also be formed along the sidewall of the sacrificial gate cap 30. The gate dielectric spacer 32 can land on a physically exposed surface of either the sacrificial liner 26 (if the same is present), or on an uppermost surface of the patterned stack PS when the sacrificial liner 26 is not present. The gate dielectric spacer 32 is composed of a gate spacer material such as, for example, silicon dioxide, SiN, SiBCN, SiOCN or SiOC. The gate dielectric spacer 32 can be formed by a deposition process, followed by a spacer etch.

Figure 8A:
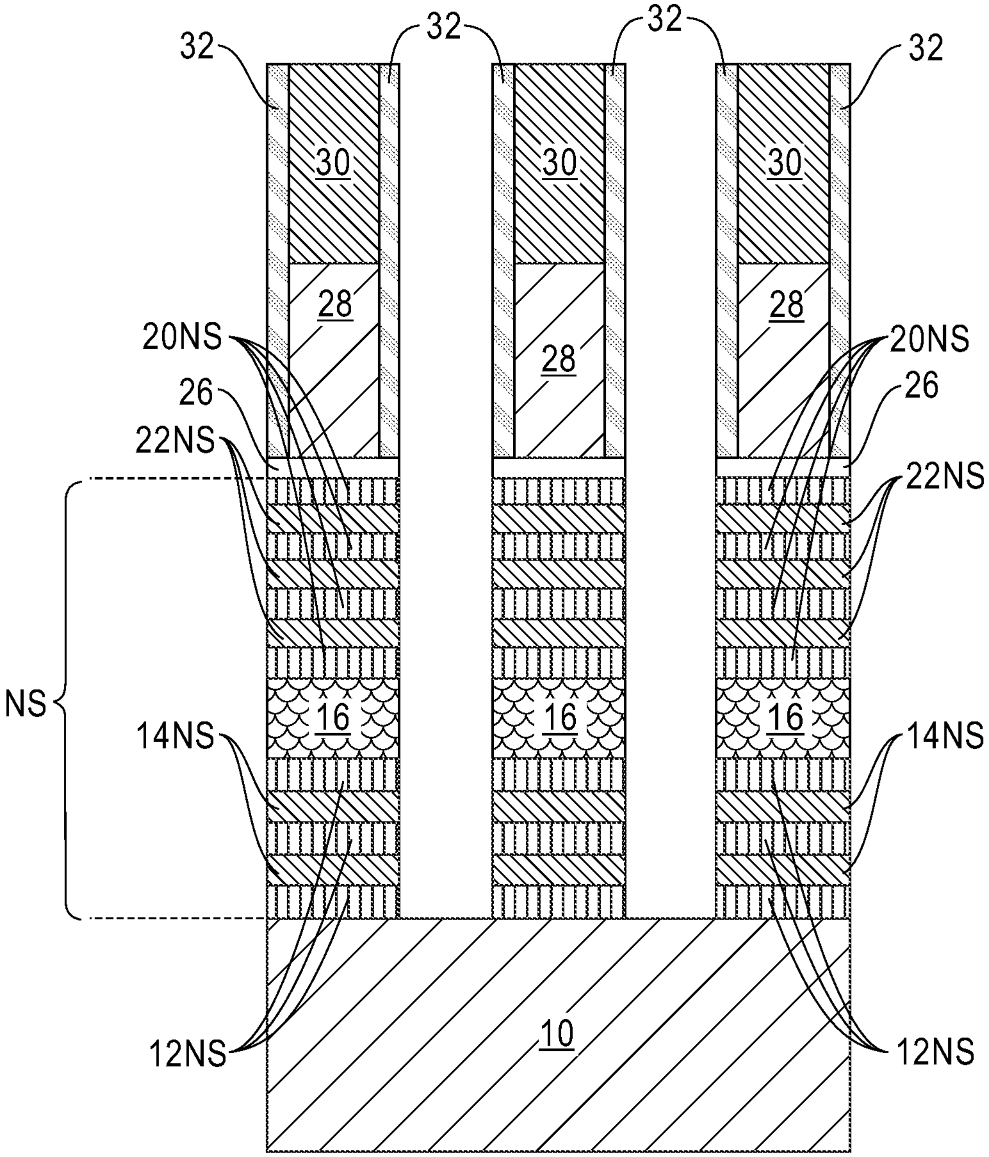
FIGS. 8A, 8B and 8C are cross sectional views of the exemplary structure shown in FIGS. 7A, 7B and 7C, respectively, after performing an etch utilizing the at least one sacrificial gate structure and the gate dielectric spacer as a combined etch mask to provide at least one nanosheet-containing stack.
Figure 8C:
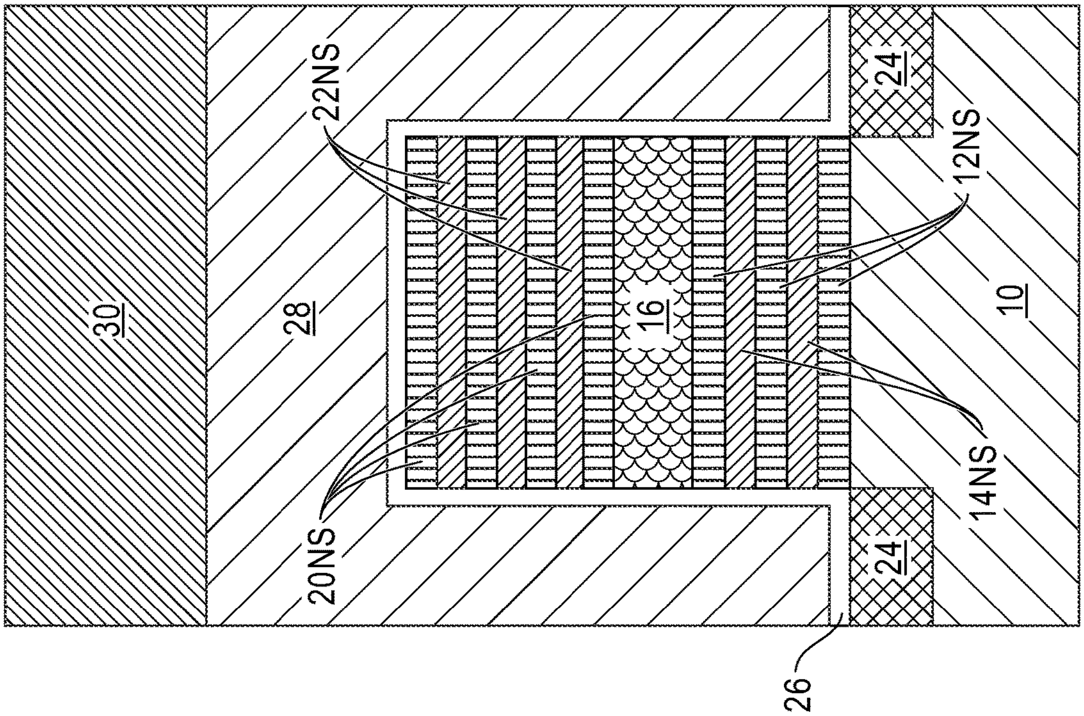
Figure 8B:
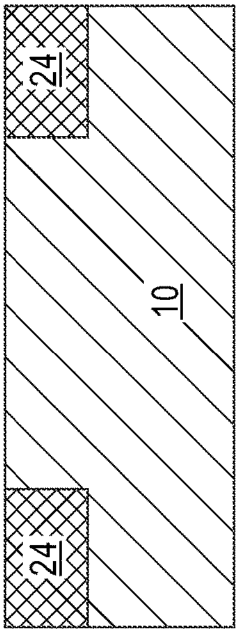

Referring now to FIGS. 8A, 8B and 8C, there are illustrated the exemplary structure shown in FIGS. 7A, 7B and 7C, respectively, after performing an etch utilizing the at least one sacrificial gate structure 28 and the gate dielectric spacer 32 as a combined etch mask to provide at least one nanosheet-containing stack NS. The etch used in forming the at least one nanosheet-containing stack NS can include any dry etching process and/or chemical wet etching process. Typically, a RIE is used in forming the at least one nanosheet-containing stack NS. The at least one nanosheet-containing stack NS includes a remaining (i.e., non-etched) portion of each of the second material stack, the bonding dielectric layer 16 and the first material stack of the patterned stack PS. Within the at least one nanosheet-containing stack NS, the non-etched portion of each second sacrificial semiconductor material layer 20 is now referred to as a second sacrificial semiconductor material nanosheet 20NS, the non-etched portion of each second semiconductor channel material layer 22 is now referred to as a second semiconductor channel material nanosheet 22NS, the non-etched portion of each first sacrificial semiconductor material layer 12 is now referred to as a first sacrificial semiconductor material nanosheet 12NS, and the non-etched portion of each first semiconductor channel material layer 14 is now referred to as a first semiconductor channel material nanosheet 14NS. The least one nanosheet-containing stack NS thus includes a first nanosheet stack of alternating first sacrificial semiconductor material nanosheets 12NS and first semiconductor channel material nanosheet 14NS, and a second nanosheet stack of alternating second sacrificial semiconductor material nanosheets 20NS and second semiconductor channel material nanosheets 22NS. In the present application, the second nanosheet stack is located above the first nanosheet stack and the first and second nanosheet stacks are spaced apart by an unetched portion of the bonding dielectric layer 16. Note that within the cut B-B and as is illustrated in FIG. 8B the patterned stack PS is entirely removed therefrom.

Figure 9A:
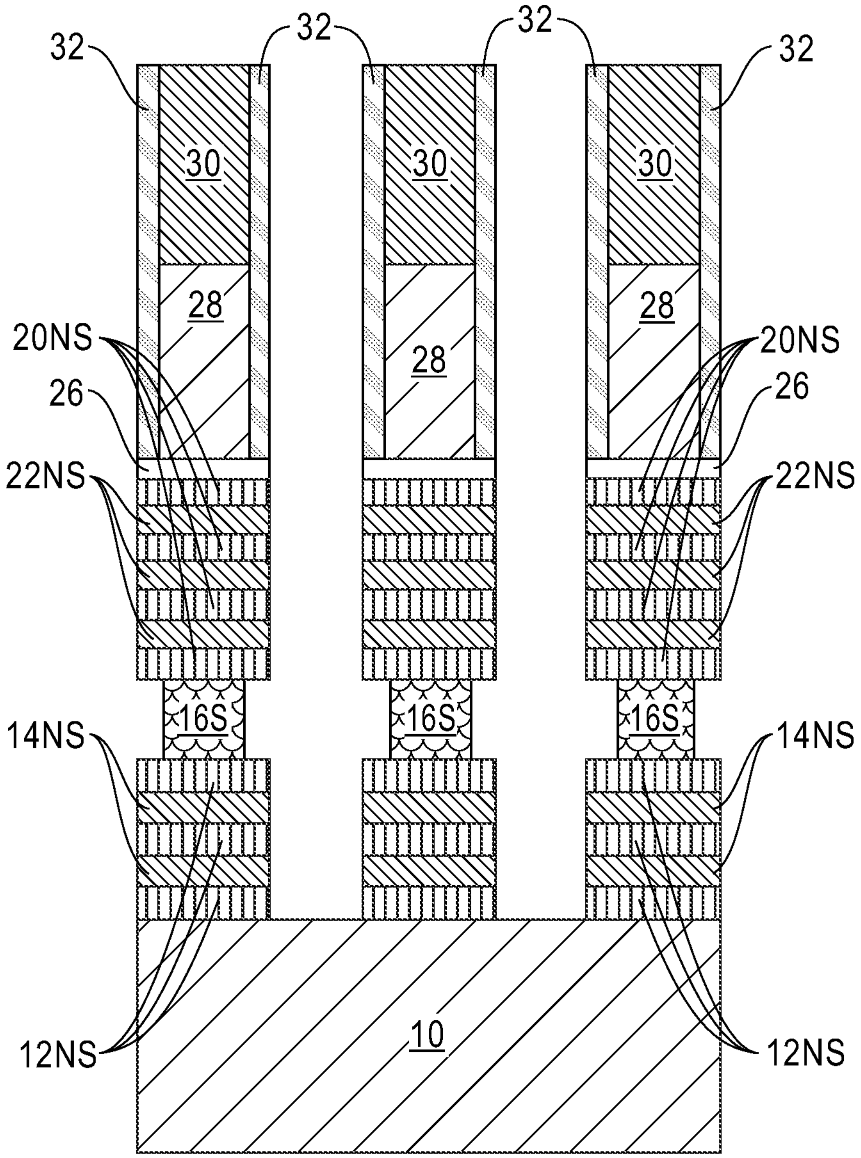
FIGS. 9A, 9B and 9C are cross sectional views of the exemplary structure shown in FIGS. 8A, 8B and 8C, respectively, after recessing the bonding dielectric layer of the at least one nanosheet-containing stack to provide a middle dielectric isolation structure.
Figure 9C:
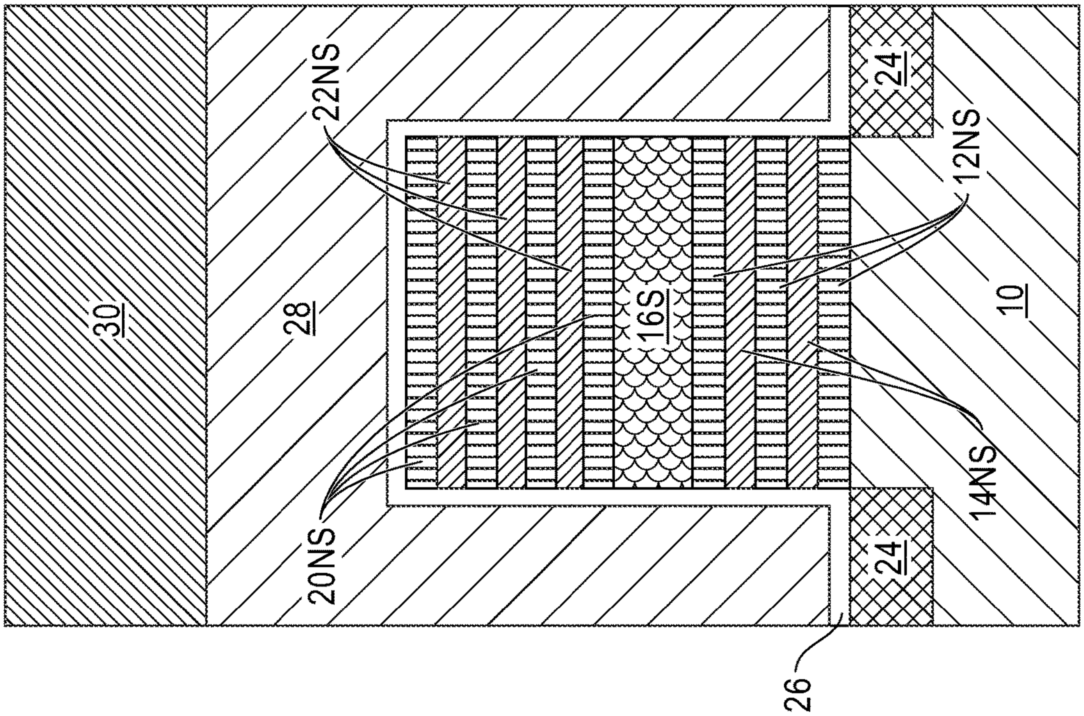
Figure 9B:
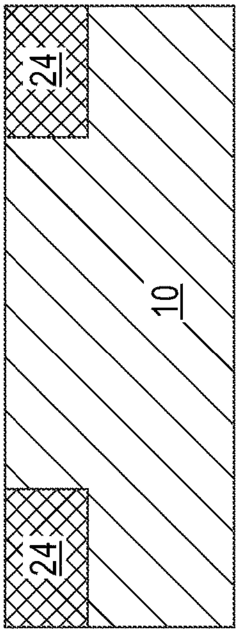

Referring now to FIGS. 9A, 9B and 9C, there are illustrated the exemplary structure shown in FIGS. 8A, 8B and 8C, respectively, after recessing the bonding dielectric layer 16 of the at least one nanosheet-containing stack to provide a middle dielectric isolation structure 16S. The recessing of the bonding dielectric layer 16 of the at least one nanosheet-containing stack includes a lateral etch that is selective in removing a portion of the bonding dielectric layer 16 of the at least one nanosheet-containing stack. The middle dielectric isolation structure 16S has a first end and a second end that is opposite the first end that are physically exposed at this point of the process.

In the present application, the middle dielectric isolation structure 16S has a width as illustrated in FIG. 9A that is less than a width of each of first semiconductor channel material nanosheets 14NS and a width of each of the second semiconductor channel material nanosheets 22NS; the first and second semiconductor channel material nanosheets have a same width.

Figure 10:
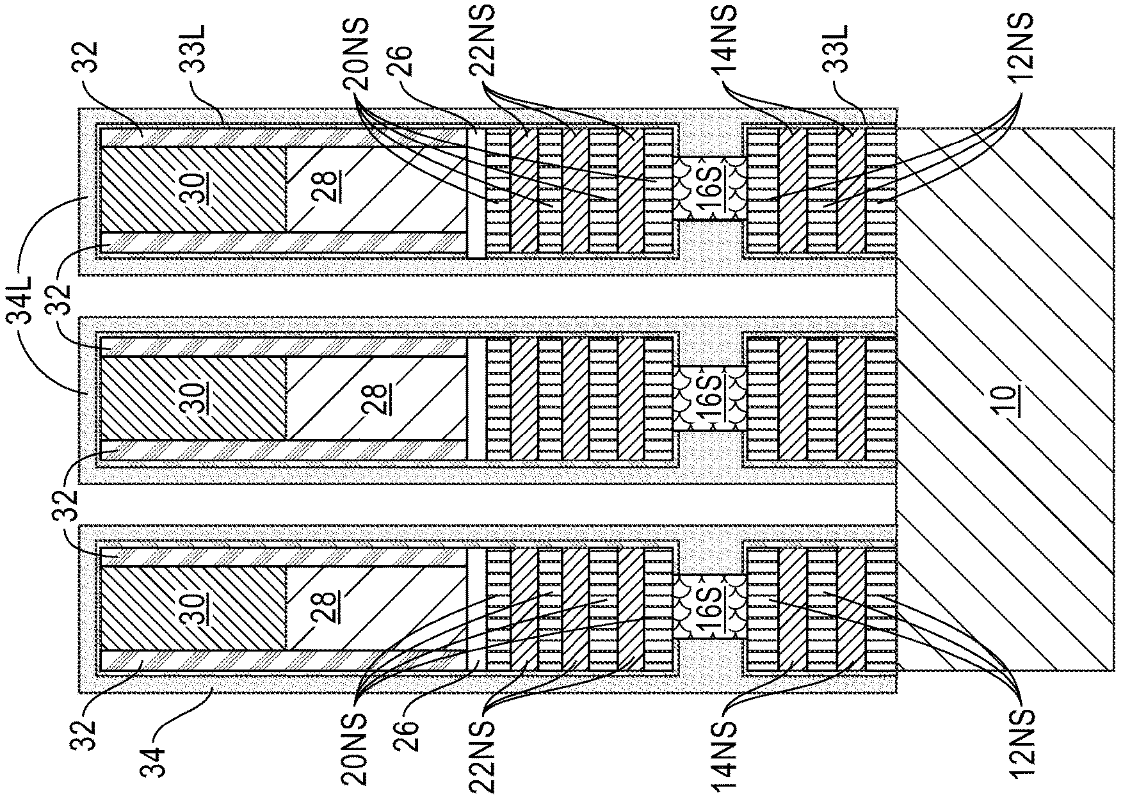
FIG. 10 is a cross sectional view of the exemplary structure shown in FIG. 9A after forming a protective liner and a dielectric spacer liner.

Referring now to FIG. 10, there is illustrated the exemplary structure shown in FIG. 9A after forming a protective liner 33L and a dielectric spacer liner 34L. The protective liner 33L is composed of a dielectric oxide such as, for example, silicon dioxide. The protective liner 33L can be formed by a deposition process such as, for example, CVD, PECVD, or ALD. The protective liner 33L is typically a conformal liner that protects the nanosheets during the subsequent recessing of the dielectric spacer liner 34L In some embodiments of the present application, the protective liner 33L can be omitted; in FIGS. 12, 13, 14A-14C and 15A-15C the protective liner 33L was omitted from the structure. The dielectric spacer liner 34L is composed of a second dielectric material that is compositionally different from the first dielectric material that provides the bonding dielectric layer 16. The second dielectric material that provides the dielectric spacer liner 34L can include SiN, SiBCN, SiOCN or SiOC. The dielectric spacer liner 34L can be formed by a deposition process such as, for example, CVD, PECVD, or ALD. Note that the dielectric spacer liner 34L contacts the first end and the second end of the middle dielectric isolation structure 16S.

Figure 11:
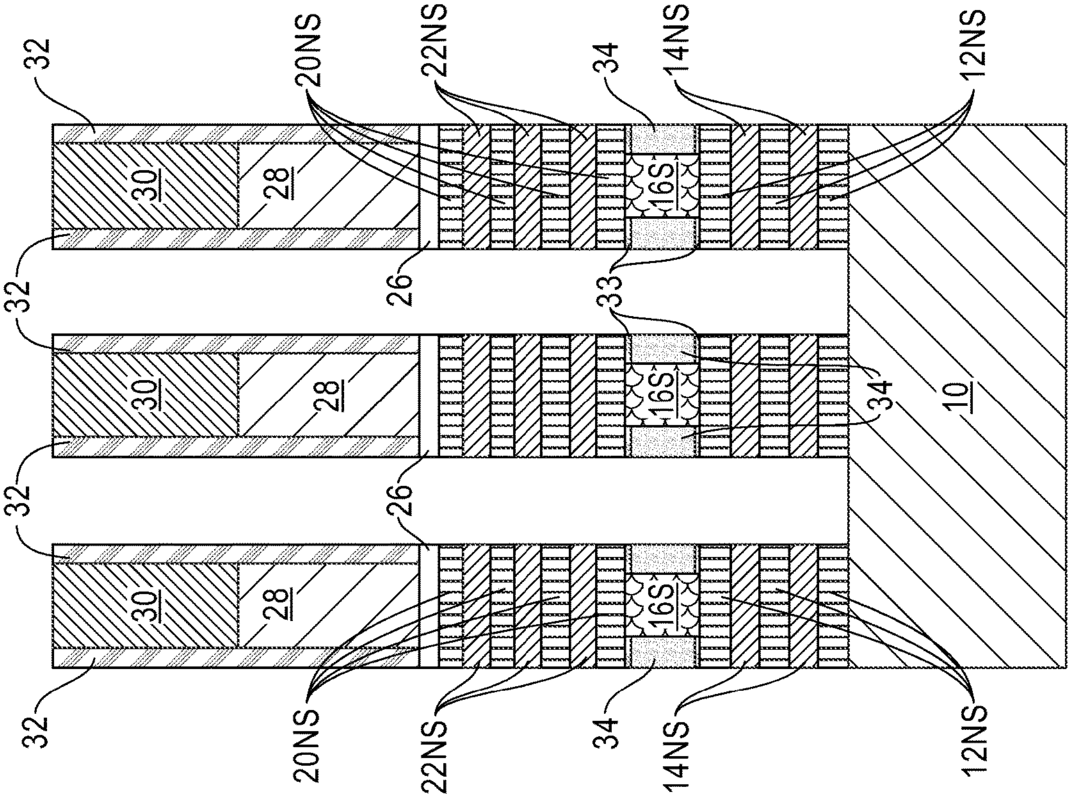
FIG. 11 is a cross sectional view of the exemplary structure shown in FIG. 10 after etching back the dielectric spacer liner and removing physically exposed portions of the protective liner.

Referring now to FIG. 11, there is illustrated the exemplary structure shown in FIG. 10 after etching back the dielectric spacer liner 34L and removing physically exposed portions of the protective liner 33L. The etching back of the dielectric spacer liner 34L provides a middle dielectric isolation spacer 34 at each of the first and second ends of the middle dielectric isolation structure 16S. Collectively, the middle dielectric isolation structure 16S and the middle dielectric isolation spacers 34 that are present an opposing ends (i.e., first end and second end) of the middle dielectric isolation structure 16S provide a multi-dielectric material middle isolation structure that will serve as an insulating region between stacked FETs. The removal of the physically exposed portions of the protective liner 33L can include an etch that is selective in removing the protective liner 33L from the structure. A portion of the protective liner 33L remains as illustrated in FIG. 11. The remaining the protective liner 33L can be referred to as a protective layer 33 that is located above and beneath each middle dielectric isolation spacer 34. In some embodiments, See, for example, FIGS. 12, 13, 14A-14C and 15A-15C, the protective layer 33 is omitted from the structure.

In the present application, the dielectric isolation spacer 34 has an inner sidewalls that is in direct physical contact with the middle dielectric isolation structure 16S, and an outer sidewall that is vertically aligned with and an outermost sidewall of each first semiconductor channel material nanosheet 14NS and an outermost sidewall of each second semiconductor channel material nanosheet 22NS; the first and second semiconductor channel material nanosheets have outer sidewalls that are vertically aligned to each other. In some embodiments, the middle dielectric isolation spacer 34 can be in direct physically contact with a topmost first sacrificial material nanosheet of the first nanosheet stack and a bottommost second sacrificial semiconductor material nanosheet of the second nanosheet stack. In other embodiments, protective layer 33 is present between the middle dielectric isolation spacer 34 and the topmost first sacrificial semiconductor material nanosheet of the first nanosheet stack and between the middle dielectric isolation spacer 34 and the bottommost second sacrificial semiconductor material nanosheet of the second nanosheet stack.

Figure 12:
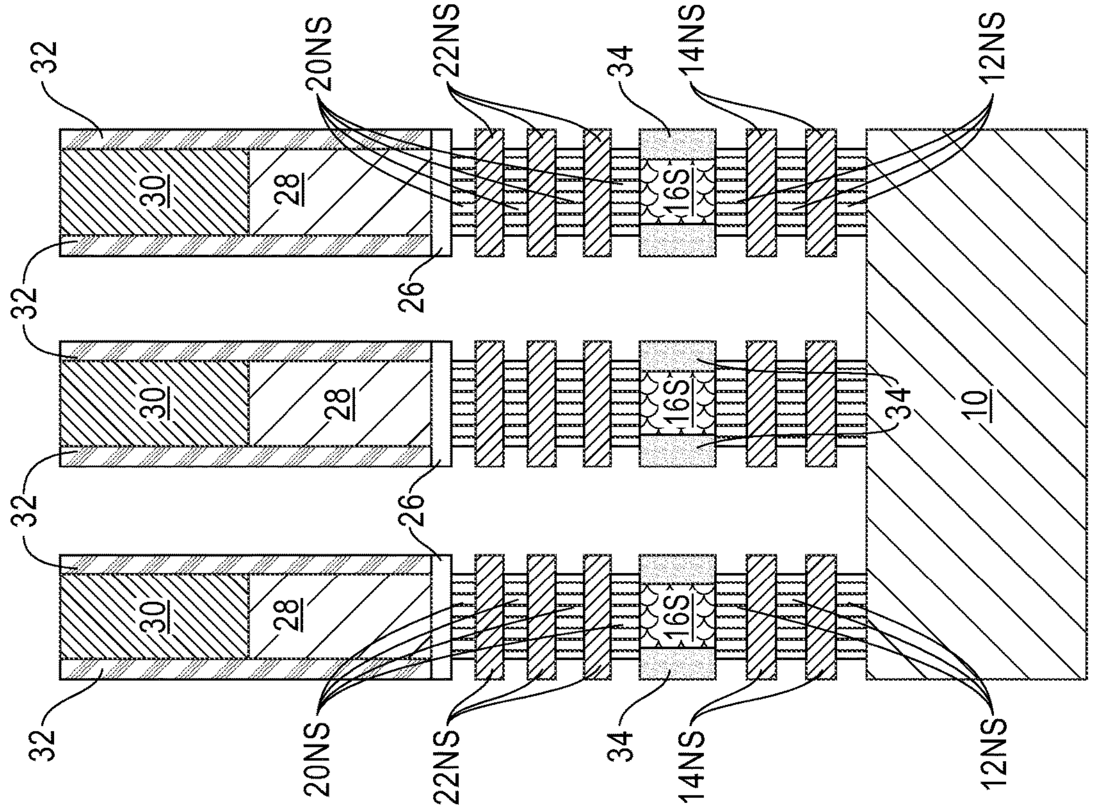
FIG. 12 is a cross sectional view of the exemplary structure shown in FIG. 11 after recessing each of the sacrificial semiconductor material nanosheets of the at least one nanosheet-containing stack.

Referring now to FIG. 12, there is illustrated the exemplary structure shown in FIG. 11 after recessing of each of the sacrificial semiconductor material nanosheets of the at least one nanosheet-containing stack. That is, each first sacrificial semiconductor material nanosheet 12NS of the first nanosheet stack and each second sacrificial semiconductor material nanosheet 20NS of the second nanosheet stack are recessed in this part of the processing utilizing a lateral etching process that is selective in partially removing each first sacrificial semiconductor material nanosheet 12NS of the first nanosheet stack and each second sacrificial semiconductor material nanosheet 20NS of the second nanosheet stack. A gap is formed at the ends of each of the recessed first sacrificial semiconductor material nanosheets 12NS of the first nanosheet stack and at each of the second sacrificial semiconductor material nanosheets 20NS of the second nanosheet stack.

Figure 13:
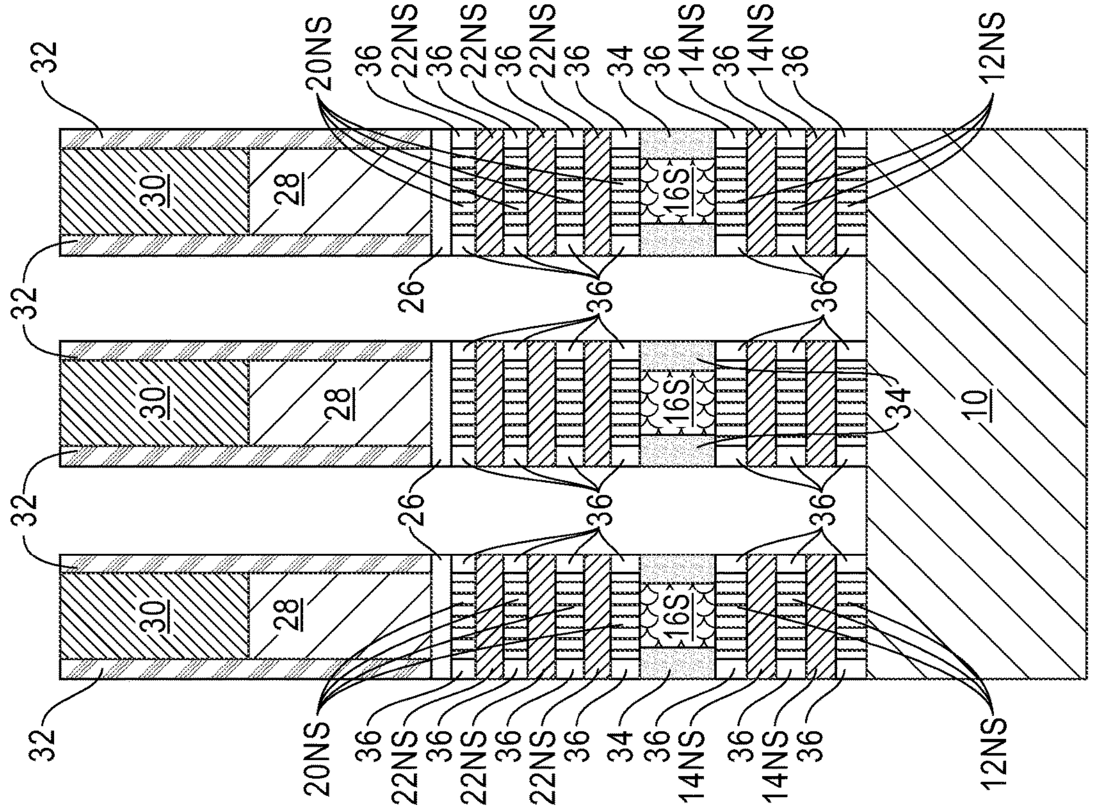
FIG. 13 is a cross sectional view of the exemplary structure shown in FIG. 12 after forming inner spacers adjacent to each end of the recessed sacrificial semiconductor material nanosheets of the at least one nanosheet-containing stack.

Referring now to FIG. 13, there is illustrated the exemplary structure shown in FIG. 12 after forming inner spacers 36 adjacent to each end of the recessed sacrificial semiconductor material nanosheets of the at least one nanosheet-containing stack. The inner spacers 36 are formed by depositing (CVD, PECVD, or ALD) a layer of inner dielectric spacer material on the exemplary structure. The inner dielectric spacer material can include, but is not limited to, silicon dioxide, SiN, SiBCN, SiOCN or SiOC. After depositing the layer of inner dielectric spacer material, an isotropic etch back process is performed on the layer of inner dielectric spacer material. This isotropic etch back process removes the layer of inner dielectric spacer material that is present on the sidewalls of the each first semiconductor channel material nanosheet 14NS, the multi-dielectric material middle isolation structure, and each second semiconductor channel material nanosheet 22NS, while maintaining the layer of inner dielectric spacer material in each gaps. The maintained layer of inner dielectric spacer material within each of the gaps provides the inner spacers 36. Note that the inner spacers 36 can be compositionally the same as, or compositionally different from, the middle dielectric isolation spacer 34 of the multi-dielectric material middle isolation structure.

Referring now to FIG. 14A, there is illustrated the exemplary structure shown in FIG. 13 after stacked FET formation. FIGS. 14B and 14C are also provided to illustrate the different regions of the exemplary structure shown in FIG. 14A. The forming of the stacked FETs includes forming first (or bottom) source/drain regions 42, followed by forming a first frontside interlayer dielectric (ILD) layer 44, then forming second (or top) source/drain regions 46, followed by forming a second frontside ILD layer 48. The first source/drain regions 42 and the top source/drain regions 46 are typically formed by an epitaxial growth process, as defined above. As used herein, a “source/drain” region can be a source region or a drain region depending on subsequent wiring and application of voltages during operation of the FET. The first source/drain regions 42 and the second source/drain regions 46 are composed of a semiconductor material, as defined above, and a dopant. The semiconductor material that provides the first source/drain regions 42 can be compositionally the same as, or compositionally different from, the semiconductor material that provides the second source/drain regions 42. The semiconductor material that provides the first source/drain regions 42 can be compositionally the same as, or compositionally different from, the second semiconductor material that provides each first semiconductor channel material nanosheet 14NS and the semiconductor material that provides the second source/drain regions 46 can be compositionally the same as, or compositionally different from, the third semiconductor material that provides each second semiconductor channel material nanosheet 22NS. The dopant that is present in each of the first source/drain regions 42 and the second source/drain regions 46 can be either a p-type dopant or an n-type dopant. In some embodiments of the present application, the dopant that is present in the first source/drain regions 42 is of a same conductivity type as the dopant that is present in the second source/drain regions 46 (e.g., both can be n-type or p-type). In other embodiments of the present application, the dopant that is present in the first source/drain regions 42 is of a different conductivity type than the dopant that is present in the second source/drain regions 46 (e.g., one of the source/drain regions is p-type and the other source/drain region is n-type). The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region can have a dopant concentration of from $4\times10^{20}$ atoms/cm$^3$ to $3\times10^{21}$ atoms/cm$^3$. In one example, each bottom source/drain region is composed of phosphorus doped silicon.

The first frontside ILD layer 44 and the second frontside ILD layer 48 are composed of an ILD material. The ILD material that provides the first frontside ILD layer 44 can be compositionally the same as, or compositionally different from, the ILD material that provides the second frontside ILD layer 48. Note that in FIG. 14B, the first frontside ILD layer 44 and the second frontside ILD layer 48 are collective shown as frontside ILD layer 49. The ILD material that provides the first frontside ILD layer 44 and the second frontside ILD layer 48 includes, but is not limited to, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 3.9 (all dielectric constants mentioned herein are relative to a vacuum unless otherwise noted). The ILD material that provides first frontside ILD layer 44 and the second frontside ILD layer 48 can be formed by a deposition process including, but not limited to, CVD, PECVD or spin-on coating. A planarization process such as, for example, chemical mechanical polishing (CMP) follows the deposition process. The planarization process used in providing the second frontside ILD layer 48 can remove the sacrificial gate cap 30 and an upper portion of the gate dielectric spacer 32 that was present along the sidewalls of the sacrificial gate cap 30. The at least one sacrificial gate structure 28 is revealed after forming the second frontside ILD layer 48.

The least one sacrificial gate structure 28 and the sacrificial liner 26 are then removed to reveal the at least one nanosheet-containing stack. The least one sacrificial gate structure 28 and the sacrificial liner 26 can be removed utilizing at least one material removal process such as, for example, etching, which is selective in removing the least one sacrificial gate structure 28 and the sacrificial liner 26. In some embodiments, a first etch is used to remove the sacrificial gate structure 28 and a second etch is used to remove the sacrificial liner 26.

After removing the least one sacrificial gate structure 28 and the sacrificial liner 26, each first sacrificial semiconductor material nanosheet 12NS and each second sacrificial semiconductor material nanosheet 20NS are removed to suspend a middle portion of the following: each first semiconductor channel material nanosheet 14NS, the middle dielectric isolation structure 16S of the multi-dielectric material middle isolation structure, and each second semiconductor channel material nanosheet 22NS. The removal of each first sacrificial semiconductor material nanosheet 12NS and each second sacrificial semiconductor material nanosheet 20NS is performed utilizing any material removal process such as, for example, etching, which is selective in removing the semiconductor material that was used in providing the first sacrificial semiconductor material nanosheets 12NS and the second sacrificial semiconductor material nanosheets 20NS.

A gate structure 38 is the formed. The gate structure 38 wraps around each first semiconductor channel material nanosheet 14NS, the middle dielectric isolation structure 16S of the multi-dielectric material middle isolation structure, and each second semiconductor channel material nanosheet 22NS. The gate structure 38 includes a gate dielectric layer and a gate electrode (both of which are not individually shown but intended to be included in the region designated as gate structure 38. The gate dielectric layer of the gate structure 38 is formed directly on physically exposed surfaces of each first semiconductor channel material nanosheet 14NS, middle dielectric isolation structure 16S, and each second semiconductor channel material nanosheet 22NS. The gate electrode is formed on the gate dielectric layer. The gate dielectric layer is composed of a first gate dielectric material that has a dielectric constant of greater than 3.9. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material that provides the gate dielectric layer can further include dopants such as lanthanum (La), aluminum (Al) and/or magnesium (Mg).

The gate electrode of the gate structure 38 is composed of a gate electrode material. The gate electrode material can include a first work function metal (WFM) and optionally a first conductive metal. The first WFM can be used to set a threshold voltage of the transistor to a desired value. In some embodiments, the first WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the first WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional first conductive metal can include, but is not limited to aluminum (Al), tungsten (W), or cobalt (Co). The gate structure 38 including the gate dielectric layer and the gate electrode can be formed by deposition of the gate dielectric material and the gate electrode material, followed by a planarization process which removes any gate dielectric material and gate electrode material that is formed above the remaining gate dielectric spacers 32.

Although not illustrated, it is possible to form a first gate structure that wraps around each of the first semiconductor channel material nanosheets 14NS that is compositionally different from a second gate structure that wraps around the each of the second semiconductor channel material nanosheets 22NS. This would include an etch that removes the gate electrode and, optionally, the gate dielectric material from around the second semiconductor channel material nanosheets 22NS and reforming a compositionally different gate electrode material and optionally, a compositionally different gate dielectric material around the second semiconductor channel material nanosheets 22NS. In the present application, the gate structure 38 can be a shared gate structure of first FET, T1, and second FET, T2. In the present application, T1 and T2 can be of a same conductivity type (n-type or p-type) or they can be of opposite conductivity types (i.e., p-type or n-type).

In the present application, the gate structure 38 that is wrapped around the first semiconductor channel material nanosheets 14NS, and the first source/drain regions 42 are components of a first FET, T1, and the gate structure 38 that is wrapped around the second semiconductor channel material nanosheets 22NS, and the second source/drain regions 46 are components of a second FET, T2. In the present application, the second FET is stacked above the first FET, and the first FET is isolated from the second FET by the multi-dielectric material middle isolation structure. In this embodiment, the gate structure 38 directly contacts the middle dielectric isolation structure 16S as shown in FIG. 14C.

After forming the gate structure 38, the gate structure 38 can be optionally recessed and a gate cap 40 can be formed on top of the recessed gate structure as shown in FIGS. 14A and 14C. The gate cap 40 is composed of a hard mask material as defined above for the sacrificial gate cap 30. The gate cap 40 can be formed by deposition of a hard mask material, followed by a planarization process.

A gate cut structure 50 can be formed as shown in FIG. 14C utilizing a conventional gate cut process. The gate cut structure 50 is composed of a dielectric material or combination of dielectric materials. Illustrative dielectric materials that can be used in providing the gate cut structure 50 include, but are not limited to silicon dioxide, SiN, SiBCN, SiOCN or SiOC.

FIGS. 14A-14C illustrates a semiconductor device in accordance with an embodiment of the present application. In this embodiment, the semiconductor device includes first FET, T1, second FET, T2, stacked over the first FET, and a multi-dielectric material middle isolation structure located between the first FET and the second FET. The multi-dielectric material middle isolation structure includes middle dielectric isolation structure 16S having a first end and a second end, opposite the first end, and middle dielectric isolation spacer 34 is located at the first end and the second end of the middle dielectric isolation structure 16S.

Figure 15A:
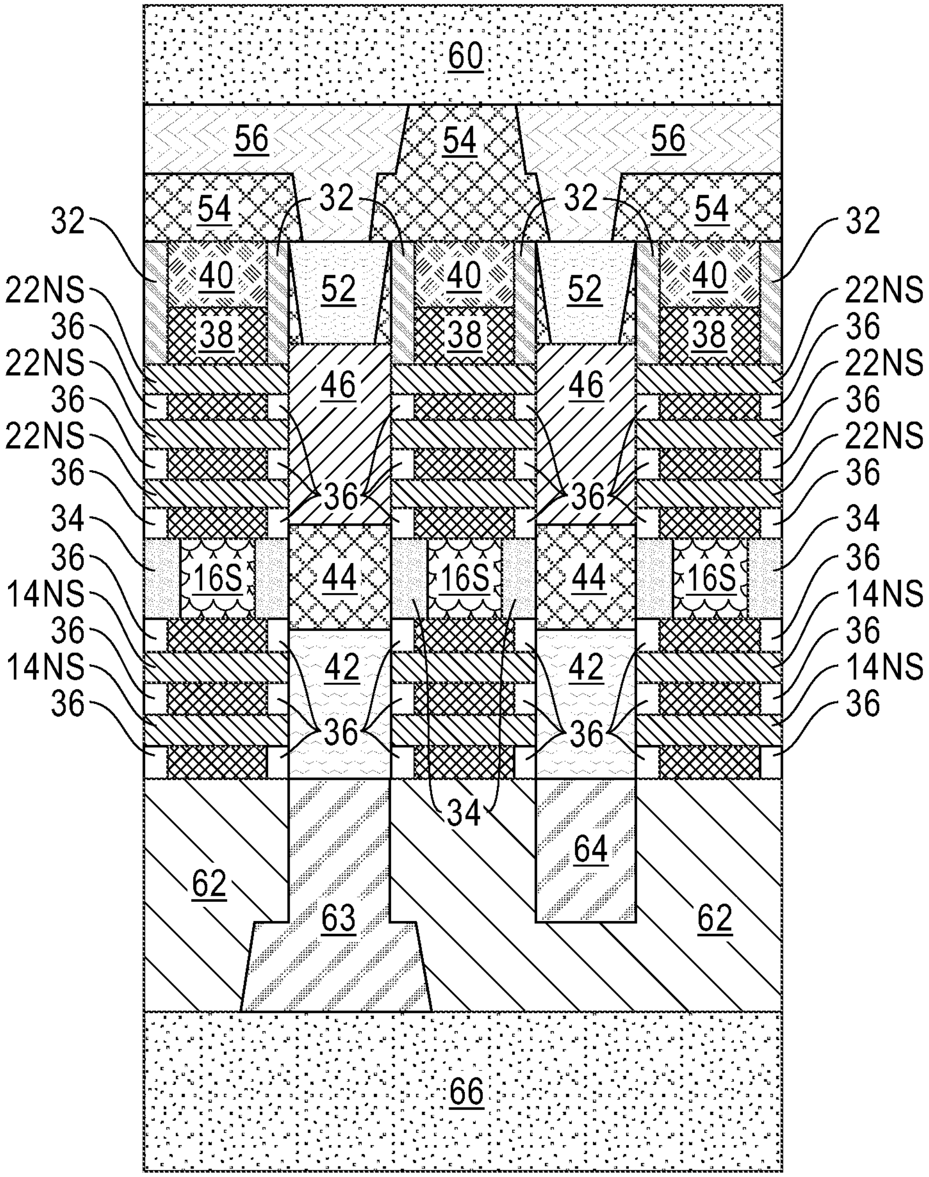
FIGS. 15A, 15B and 15C are cross sectional views of the exemplary structure shown in FIGS. 14A, 14B and 14C, respectively, after performing additional frontside processing and subsequent backside processing.
Figure 15C:
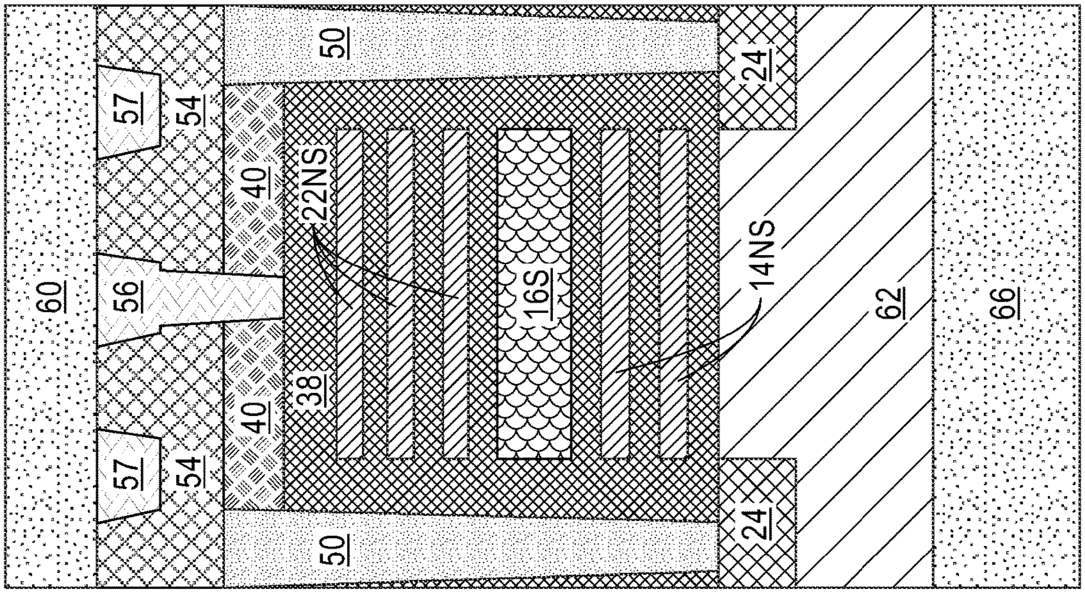
Figure 15B:
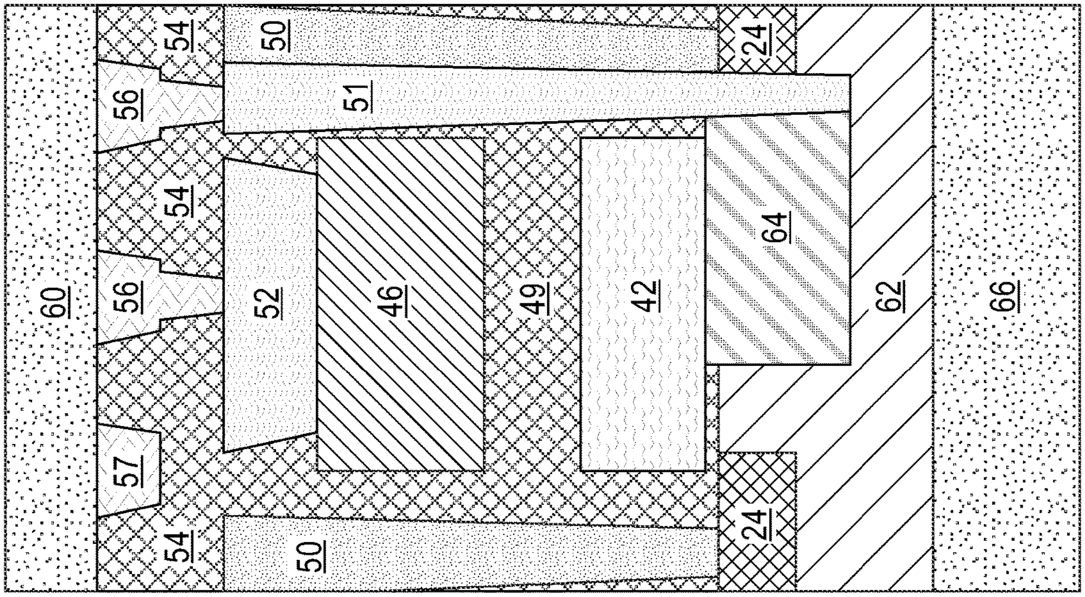

Referring now to FIGS. 15A, 15B and 15C, there are illustrated the exemplary structure shown in FIGS. 14A, 14B and 14C, respectively, after performing additional frontside processing and subsequent backside processing. The additional frontside processing can including forming additional ILD material layers on the second frontside ILD layer 48. In the present application, the additional ILD material layers and the second frontside ILD layer 48 collectively provide a middle-of-the-line (MOL) dielectric layer 54. The additional ILD material layer can include one of the ILD materials mentioned above for the first frontside ILD layer 44 and the additional ILD material layers can be formed by a deposition process as described above in forming the first frontside ILD layer 44.

Various frontside contact structures are formed in a lower portion of the MOL dielectric layer 54 utilizing a metallization process that is well known to those skilled in the art. The various frontside contact structures can include, for example, top frontside source/drain contact structures 52 (that contact the second source/drain regions 46), and contact via structure 51 (that contacts a backside source/drain contact structure 64). The various frontside contact structures are composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Various metal structures including a combined metal line/via structure 56, and a metal line structure 57 can be formed in an upper portion of the MOL dielectric layer 54 utilizing conventional damascene processes that are well known in the art. The various metal structures can be composed of an electrically conductive metal (e.g., Cu, W, Co, Ru, or Al) or an electrically conductive metal alloy (e.g., Cu—Al alloy). In the present, some of the combined metal line/via structure 56 can be in electrical contact with the top frontside source/drain contact structures 52, while other can be in electrical contact with the contact via structure 51, while yet others can be in electrical contact with the gate structure 38 of the second transistor. In the present application, the various metal structures including combined metal line/via structure 56, and metal line structure 57 and the upper portion of the MOL dielectric layer 54 can be referred to as a lower interconnect level of a back-end-of-the-line (BEOL) structure. Additional BEOL levels 60 can be formed on top of the lower interconnect level containing the various metal structure mentioned above. The additional BEOL levels include interconnect dielectric material layers that contain frontside metal wires (the metal wires can be composed of any electrically conductive metal or electrically conductive metal alloy) embedded therein.

Backside processing is performed after the additional BEOL levels 60 are formed. The backside processing can include removing the semiconductor substrate 10, forming a backside ILD multilayered region 62 that includes backside source/drain contact structures 63, 64, and thereafter forming a backside interconnect structure 66. In the present application, backside source/drain contact structures 63, 64 are in electrical contact with the first source/drain regions 42. In the present application, the backside source/drain contact structure 63 is also in electrical contact with the backside interconnect structure 66, while the backside source/drain contact structure 64 is also in electrical contact with the additional BEOL structure by means of the contact via structure 51 and one of the combined metal line/via structures 56.

The backside ILD multilayered region 62 includes at least to backside ILD layers that are composed of a same or different ILD material. The ILD material used in providing the backside ILD multilayered region 62 can include an ILD material as mentioned above for the first frontside ILD layer 44. The backside ILD multilayered region 62 can be formed by deposition.

The backside source/drain contact structures 63, 64 can be formed by a metallization process and the backside source/drain contact structures 63, 64 can be composed of at least a contact conductor material, as defined above.

The backside interconnect structure 66 includes one or more interconnect dielectric material layers that contain backside metal wires (the metal wires can be composed of any electrically conductive metal or electrically conductive metal alloy) embedded therein.

In the present application, backside interconnect structure 66 is electrically connected to a first source/drain region 42 of the first FET, T1, and frontside BEOL structure is electrically connected to a second source/drain region 46 second FET, T2. In the present application. another first source/drain region 42 of the first FET, T1, is electrically connected to the frontside BEOL structure.

Figure 16A:
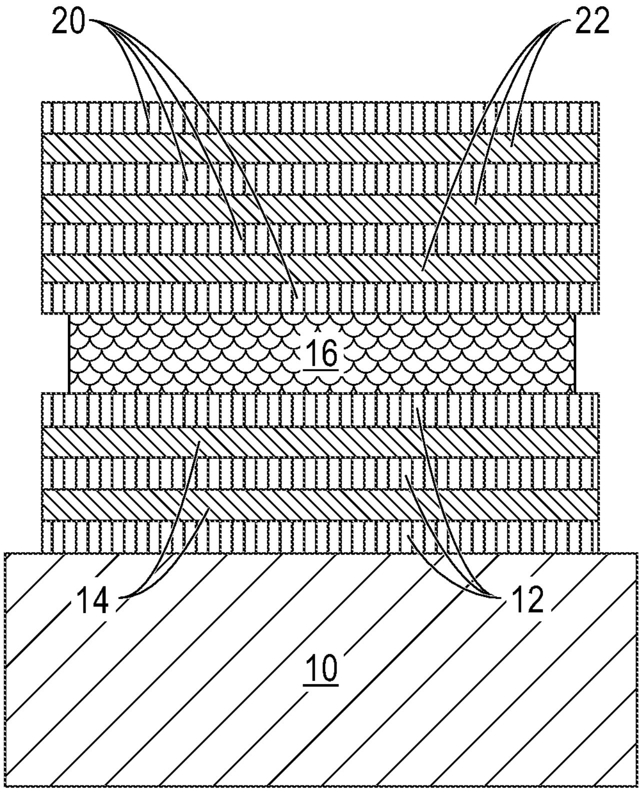
FIGS. 16A, 16B and 16C are cross sectional views of the exemplary structure shown in FIGS. 5A, 5B and 5C, respectively, after recessing the bonding dielectric layer of the patterned stack.
Figure 16B:
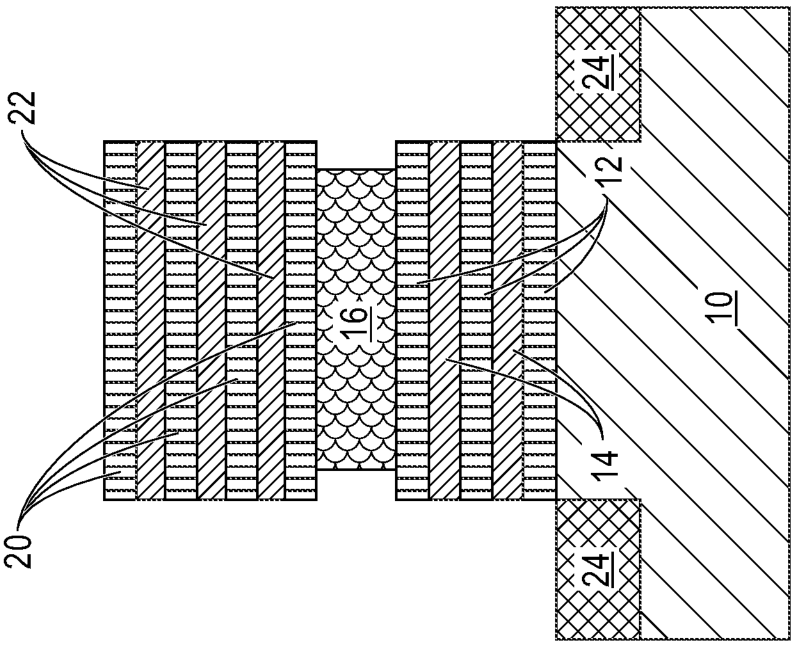
Figure 16C:
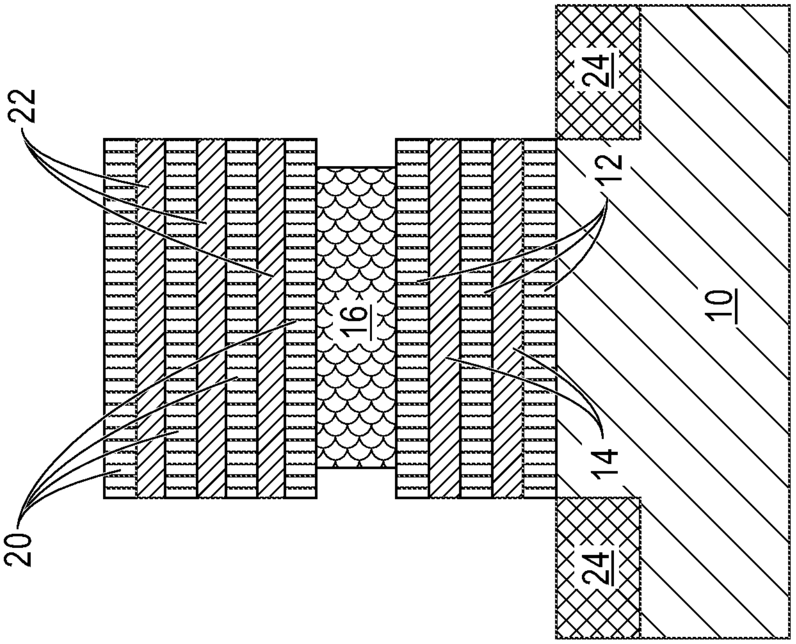

Referring now to FIGS. 16A, 16B and 16C, there are illustrated the exemplary structure shown in FIGS. 5A, 5B and 5C, respectively, after recessing the bonding dielectric layer 16 of the patterned stack PS. The recessing of the bonding dielectric layer 16 includes a lateral etch that is selective in removing a portion of the bonding dielectric layer 16 of the patterned stack PS. The recessed bonding dielectric layer 16 has a width that is less than the other layers (i.e., first sacrificial semiconductor material layers 12, first semiconductor channel material layers 14, second sacrificial semiconductor material layers 20, and second semiconductor channel material layers 22) that are present in the patterned stack PS.

Figure 17A:
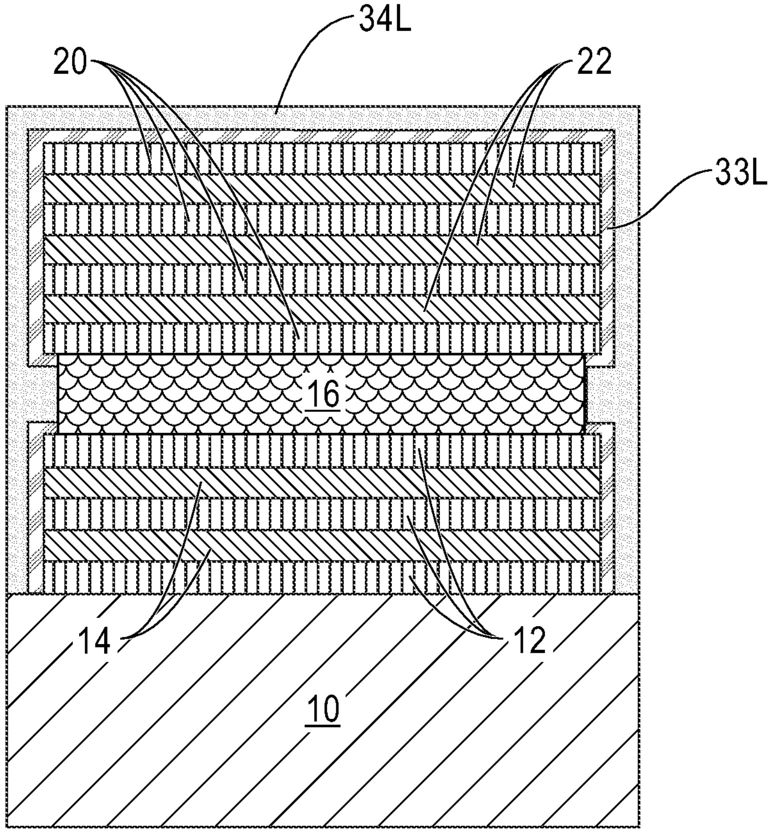
FIGS. 17A, 17B and 17C are cross sectional views of the exemplary structure shown in FIGS. 16A, 16B and 16C, respectively, after forming a protective liner and a dielectric spacer liner.
Figure 17C:
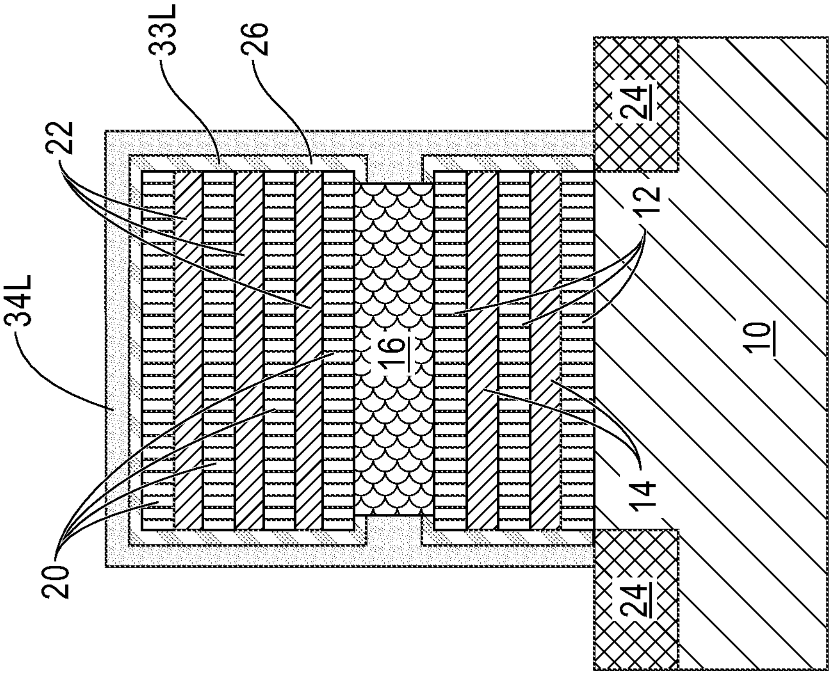
Figure 17B:
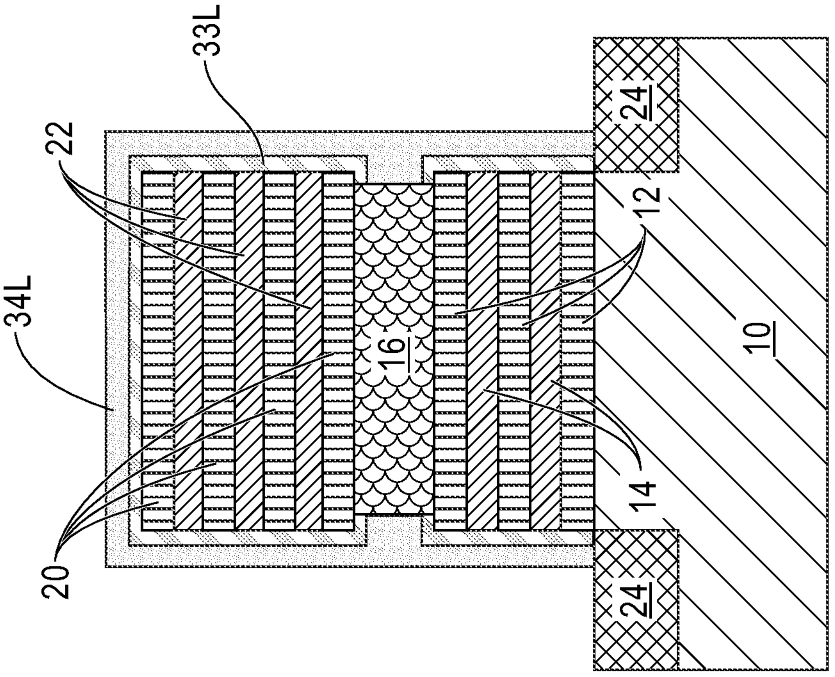

Referring now to FIGS. 17A, 17B and 17C, there are illustrated the exemplary structure shown in FIGS. 16A, 16B and 16C, respectively, after forming protective liner 33L and dielectric spacer liner 34L. The protective liner 33L and dielectric spacer liner 34L used in this embodiment of the present application are the same as described in the previous embodiment of the present application. In some embodiments, the protective liner 33L can be omitted from the structure.

Figure 18A:
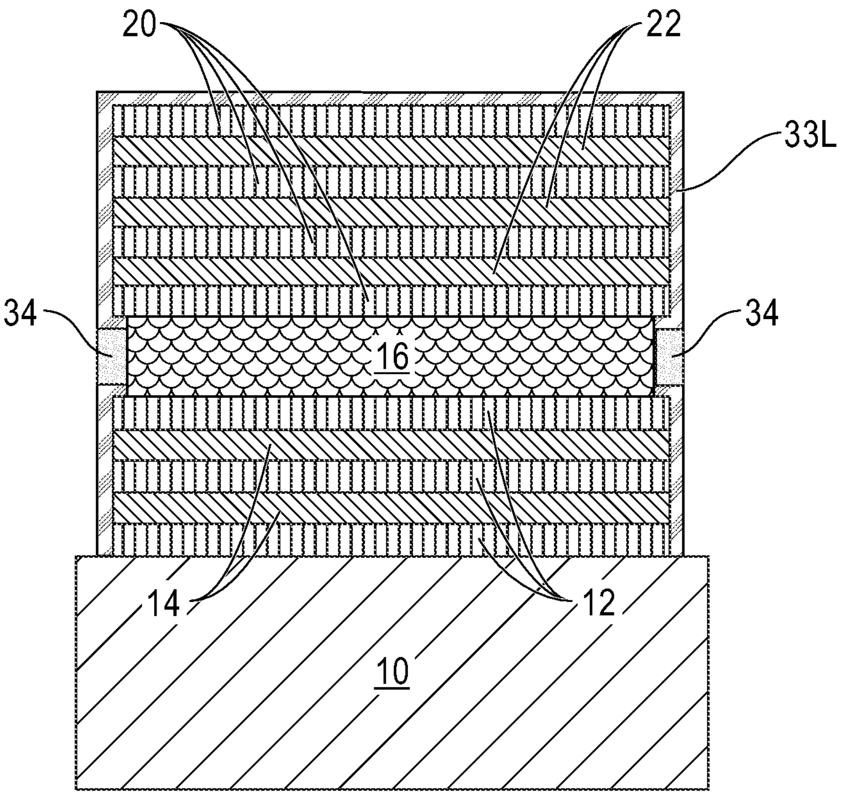
FIGS. 18A, 18B and 18C are cross sectional views of the exemplary structure shown in FIGS. 17A, 17B and 17C, respectively, after etching back the dielectric spacer liner.
Figure 18B:
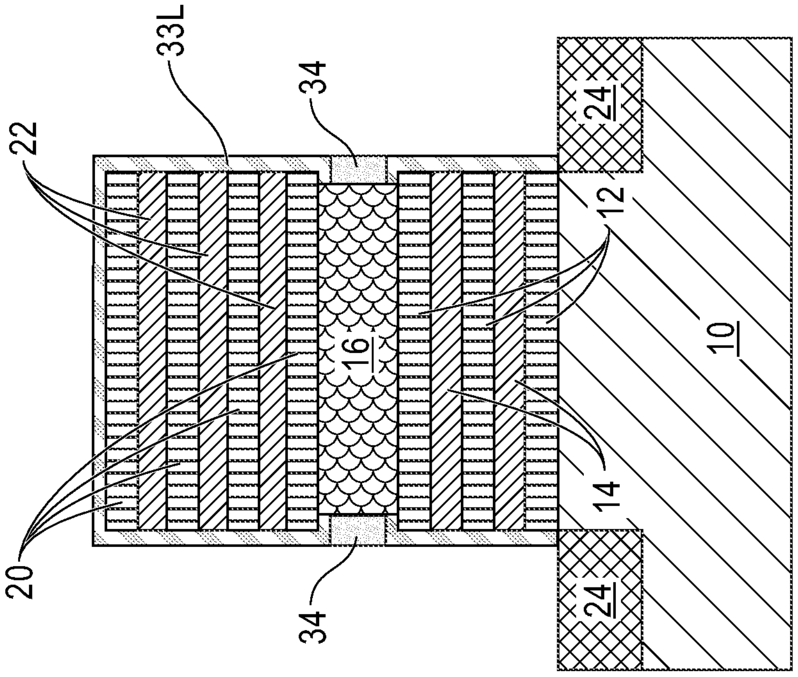
Figure 18C:
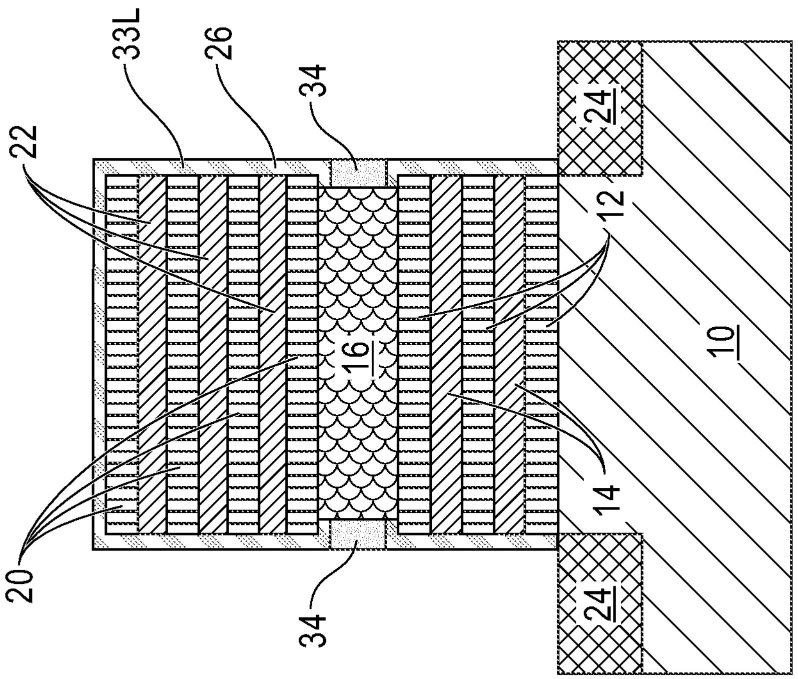

Referring now to FIGS. 18A, 18B and 18C, there are illustrated the exemplary structure shown in FIGS. 17A, 17B and 17C, respectively, after etching back the dielectric spacer liner 34L. The etching back of the dielectric spacer liner 34L provides middle dielectric isolation spacer 34 at opposing ends of the recessed dielectric layer 16. After forming the middle dielectric isolation spacer 34 at opposing sidewalls of the recessed dielectric layer 16, the exemplary structure illustrated in FIGS. 18A-18C is then subjected to the processing steps described above in FIGS. 6A-14C to provide the exemplary structure shown in FIGS. 19A-19C. Note that the exemplary structure shown in FIGS. 19A-19C is essentially the same as that shown in FIGS. 14A-14C expect that a middle dielectric isolation spacer 34 surrounds the middle dielectric isolation structure 16S. In this embodiment, the middle dielectric isolation spacer 34 is ring-shaped. The exemplary structure shown in FIGS. 19A-19B can be further processed to include the frontside and backside structures that are illustrated in FIGS. 15A-15B. Notably, this embodiment provides a semiconductor device including first FET, T1, second FET, T2, stacked over the first FET, and a multi-dielectric material middle isolation structure located between the first FET and the second FET. The multi-dielectric material middle isolation structure includes a middle dielectric isolation structure 16S having a middle dielectric isolation spacer 34 surrounding the middle dielectric isolation structure 16S.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a first field effect transistor (FET);

a second FET stacked over the first FET; and a multi-dielectric material middle isolation structure located between the first FET and the second FET, wherein the multi-dielectric material middle isolation structure comprises a middle dielectric isolation structure having a first end and a second end opposite the first end, and a middle dielectric isolation spacer located at the first end and the second end of the middle dielectric isolation structure, wherein a semiconductor channel region of the first FET is spaced apart from a bottommost surface of the middle dielectric isolation spacer, and a semiconductor channel region of the second FET is spaced apart from a topmost surface of the middle dielectric isolation spacer.

2. The semiconductor device of claim 1, wherein the middle dielectric isolation structure is composed of a first dielectric material, and the middle dielectric isolation spacer is composed of a second dielectric material that is compositionally different from the first dielectric material.

3. The semiconductor device of claim 1, further comprising a protective layer located on a topmost surface and a bottommost surface of the middle dielectric isolation spacer.

4. The semiconductor device of claim 1, wherein the semiconductor channel region of the first FET comprises a plurality of vertical stacked and spaced apart first semiconductor channel material nanosheets and the semiconductor channel region of the second FET comprises a plurality of vertical stacked and spaced apart second semiconductor channel material nanosheets.

5. The semiconductor device of claim 1, wherein the first FET comprises a first gate structure wrapped around a plurality of vertical stacked and spaced apart first semiconductor channel material nanosheets, and first source/drain regions, and the second FET comprises a second gate structure wrapped around a plurality of vertical stacked and spaced apart second semiconductor channel material nanosheets, and second source/drain regions, wherein the first source/drain regions are spaced apart from the second source/drain regions by a frontside interlayer dielectric (ILD) layer.

6. The semiconductor device of claim 1, wherein the first FET is of a different conductivity type than the second FET.

7. The semiconductor device of claim 1, wherein the first FET and the second FET comprise a shared gate structure, and the shared gate structure directly contacts the middle dielectric isolation structure.

8. The semiconductor device of claim 1, wherein the first FET and the second FET comprise a shared gate structure, and the shared gate structure is isolated from each sidewall of the middle dielectric isolation structure by another middle dielectric isolation spacer.

9. The semiconductor device of claim 1, further comprising a frontside back-end-of-the-line (BEOL) structure located above the second FET, and a backside interconnect structure located beneath the first FET.

10. The semiconductor device of claim 9, wherein the backside interconnect structure is electrically connected to a first source/drain region of the first FET and the frontside BEOL structure is electrically connected to a source/drain region of the second FET.

11. The semiconductor device of claim 10, wherein another first source/drain region of the first FET is electrically connected to the frontside BEOL structure.

12. A semiconductor device comprising:

a first field effect transistor (FET);

a second FET stacked over the first FET; and a multi-dielectric material middle isolation structure located between the first FET and the second FET, wherein the multi-dielectric material middle isolation structure comprises a middle dielectric isolation structure having a first end and a second end opposite the first end, and a middle dielectric isolation spacer located at the first end and the second end of the middle dielectric isolation structure, wherein the middle dielectric isolation spacer has an inner sidewall in direct physical contact with the middle dielectric isolation structure and an outer sidewall that is vertically aligned to each vertically stacked and spaced apart first semiconductor channel material nanosheet of the first FET and to each vertically stacked and spaced apart second semiconductor channel material nanosheet of the second FET.

13. A semiconductor device comprising:

a first field effect transistor (FET);

a second FET stacked over the first FET; and a multi-dielectric material middle isolation structure located between the first FET and the second FET, wherein the multi-dielectric material middle isolation structure comprises a middle dielectric isolation structure having a middle dielectric isolation spacer surrounding the middle dielectric isolation structure, wherein a semiconductor channel region of the first FET is spaced apart from a bottommost surface of the middle dielectric isolation spacer, and a semiconductor channel region of the second FET is spaced apart from a topmost surface of the middle dielectric isolation spacer.

14. The semiconductor device of claim 13, wherein the middle dielectric isolation structure is composed of a first dielectric material, and the middle dielectric isolation spacer is composed of a second dielectric material that is compositionally different from the first dielectric material.

15. The semiconductor device of claim 13, further comprising a protective layer located on a topmost surface and a bottommost surface of the middle dielectric isolation spacer.

16. The semiconductor device of claim 13, wherein the semiconductor channel region of the first FET comprises a plurality of vertical stacked and spaced apart first semiconductor channel material nanosheets and the semiconductor channel region of the second FET comprises a plurality of vertical stacked and spaced apart second semiconductor channel material nanosheets.

17. The semiconductor device of claim 13, wherein the first FET and the second FET comprise a shared gate structure, and the shared gate structure directly contacts the middle dielectric isolation structure.

18. The semiconductor device of claim 13, further comprising a frontside back-end-of- the-line (BEOL) structure located above the second FET, and a backside interconnect structure located beneath the first FET, wherein the backside interconnect structure is electrically connected to a first source/drain region of the first FET, the frontside BEOL structure is electrically connected to a source/drain region of the second FET, and another first source/drain region of the first FET is electrically connected to the frontside BEOL structure.

* * * * *